(12) United States Patent
Kim et al.

(10) Patent No.: US 7,322,507 B2
(45) Date of Patent: Jan. 29, 2008

(54) TRANSDUCER ASSEMBLY, CAPILLARY AND WIRE BONDING METHOD USING THE SAME

(75) Inventors: Song Hak Kim, Seoul (KR); Jae Sung Kwak, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/192,193

(22) Filed: Jul. 27, 2005

(65) Prior Publication Data

US 2006/0169739 A1    Aug. 3, 2006

(30) Foreign Application Priority Data

Jan. 17, 2005  (KR) ............... 10-2005-0004319
Feb. 1, 2005   (KR) ............... 10-2005-0009160

(51) Int. Cl.
*B23K 1/00*    (2006.01)
*B23K 1/06*    (2006.01)

(52) U.S. Cl. ............. 228/1.1; 228/4.5; 219/76.13; 219/85.18

(58) Field of Classification Search ............ 228/1.1, 228/110.1, 180.5, 4.5
See application file for complete search history.

(56) References Cited

U.S. PATENT DOCUMENTS

| | | | |
|---|---|---|---|
| 3,320,401 A * | 5/1967 | Zachry et al. ............... 219/119 |
| 4,115,230 A * | 9/1978 | Beckman .................... 204/431 |
| 4,315,128 A * | 2/1982 | Matcovich et al. ...... 219/85.16 |
| 4,513,190 A * | 4/1985 | Ellett et al. ............. 219/56.21 |
| 4,691,854 A * | 9/1987 | Haefling et al. ............. 228/4.5 |
| 4,909,427 A * | 3/1990 | Plaisted et al. ............. 228/4.5 |
| 4,950,866 A * | 8/1990 | Kojima et al. ......... 219/137 PS |
| 4,958,762 A * | 9/1990 | Shimizu et al. .............. 228/1.1 |
| 5,433,369 A * | 7/1995 | Okumura ................. 228/110.1 |
| 5,891,744 A * | 4/1999 | Lowrey et al. ................ 438/14 |
| 6,110,777 A * | 8/2000 | Lowrey et al. ............. 438/255 |
| 6,578,753 B1 * | 6/2003 | Sakakura ................. 228/110.1 |
| 6,874,673 B2 * | 4/2005 | Nishiura et al. ......... 228/180.5 |
| 2004/0000577 A1 * | 1/2004 | Nishiura et al. ......... 228/180.5 |

FOREIGN PATENT DOCUMENTS

JP    02192138 A  *  7/1990
JP    02192139 A  *  7/1990

* cited by examiner

*Primary Examiner*—Kiley Stoner
(74) *Attorney, Agent, or Firm*—Weiss & Moy P.C.

(57) ABSTRACT

A transducer assembly and wire bonding method has a vibration unit for generating an ultrasonic wave. A body section is coupled to the vibration unit for transferring the ultrasonic wave. A tapered horn is coupled to the body section for transferring and concentrating the ultrasonic wave. A capillary is coupled to a front section of the horn. The capillary has a channel running the length thereof. A wire is inserted through the channel. A discharge device is coupled to the capillary for forming a ball on the wire for wire bonding.

18 Claims, 25 Drawing Sheets

TRANSDUCER ASSEMBLY, CAPILLARY AND WIRE BONDING METHOD USING THE SAME

FIELD OF THE INVENTION

The present invention relates to a wire bonding device and, more specifically, a transducer assembly, capillary and wire bonding method using the same.

DESCRIPTION OF THE RELATED ART

In general, wire bonding in the process of manufacturing a semiconductor device refers to a step of interconnecting bond pads of a semiconductor die with electrically conductive patterns of a substrate through gold wires, etc. The wire bonding includes interconnection between bond pads of a semiconductor die or interconnection between electrically conductive patterns of a substrate.

Wire bonding as described above is performed by a wire bonder which includes a discharge tip, a transducer body, a horn and a capillary. The discharge tip forms a ball on a wire. The transducer body has a vibrator for producing ultrasonic wave energy. The horn, coupled to the transducer body, transfers the ultrasonic energy, and determines the trace of the wire. The capillary, coupled to the horn, performs the wire bonding or wire cutting. The discharge tip is assembled to one side of the wire bonder and the transducer body is assembled with the bond head. Here, a transducer assembly is defined as an assembly including the transducer body, the horn and the capillary.

Wire bonding by use of such a wire bonder includes a first step of ball bonding and a second step of stitch bonding. Specifically, one end of a wire is attached to a bond pad of a semiconductor die through ball bonding, and the other end of the wire is then attached to a wire pattern of a substrate through stitch bonding. Of course, in the first step of ball bonding, the discharge tip forms a ball having a larger diameter than that of the wire.

Here, the bonding area between the wire and the bond pad by the ball bonding is formed to have a size substantially corresponding to the diameter of the ball, which is a relatively wide area. However, the bonding area between the wire and the wire pattern by the stitch bonding is formed to have a size substantially corresponding to the contact area between a lower periphery of the capillary and the wire pattern, which is a very small area. Actually, the bonding area between the wire and the wire pattern by the stitch bonding corresponds to only 2~10% of the bonding area by the ball bonding. Further, the bonding area proportion by the ball bonding is nearly uniform, but the bonding area proportion by the stitch bonding is not uniform and shows large variations. Therefore, in the actual field of semiconductor devices, the quality of the ball bonding is guaranteed to a certain degree but the quality of the stitch bonding is not guaranteed at all.

In order to solve this problem, a method employing ball bonding for both the first bonding step and the second bonding step may be used. In this method, the first ball bonding is performed for a bond pad of a semiconductor die, and the second ball bonding is then performed for a wire pattern of a substrate. However, in this method, although it is possible to form the first ball on a wire, it is nearly impossible to actually form the second ball on the wire. Thus, this method has not been applied to an actual semiconductor device as of yet. In other words, when ball bonding is performed by use of a conventional wire bonder, the discharge tip is located adjacent to the wire at the lower end of the capillary so that the discharge tip can provide its flame to an exact position of the wire in the first ball bonding. However, the discharge tip is located very far from the wire at the lower end of the capillary so that the discharge tip cannot provide its flame to an exact position of the wire in the second ball bonding. That is to say, the discharge tip does not move together with the horn and capillary but is fixed to one side of the wire bonder spaced a predetermined distance from the horn and capillary. Therefore, when the first ball is formed on the wire, the horn and the capillary are moved upward to a predetermined level near the discharge tip. In other words, when the first ball is formed, the horn and the capillary are moved upward to a predetermined level near the discharge tip, which is higher than the loop height of the wire. However, because the second ball must be formed adjacent to the semiconductor die or the substrate as described above, the horn and the capillary cannot be moved up to the high position near the discharge tip. That is to say, it is impossible to form the second ball for the second ball bonding by the conventional wire bonder. Further, when electric power is applied to the discharge tip to form the second ball, the flame generated by the discharge tip may be delivered to the wire bonder itself instead of the wire, thereby causing defective wire bonding.

Furthermore, it is necessary for the conventional capillary to have a lower end having a predetermined curvature so that the wire may be easily cut after the second stitch bonding. That is, when the conventional capillary has a curved lower end, a proper size of bonding area for the stitch bonding is secured between the wire and electrically conductive pattern. However, this structure may deteriorate the ball bonding force. In other words, because the lower end of the capillary is formed curved, it is difficult to secure a strong bonding force between the ball bonding area corresponding to the curved lower end and the bond pad. In other words, the ball bonding area corresponding to the curved lower end has a relatively small ball bonding force.

Therefore, a need existed to provide a device and method for wire bonding that will overcomes the problems associated with the prior art.

SUMMARY OF THE INVENTION

A transducer assembly and wire bonding method has a vibration unit for generating an ultrasonic wave. A body section is coupled to the vibration unit for transferring the ultrasonic wave. A tapered horn is coupled to the body section for transferring and concentrating the ultrasonic wave. A capillary is coupled to a front section of the horn. The capillary has a channel running the length thereof. A wire is inserted through the channel. A discharge device is coupled to the capillary for forming a ball on the wire for wire bonding.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
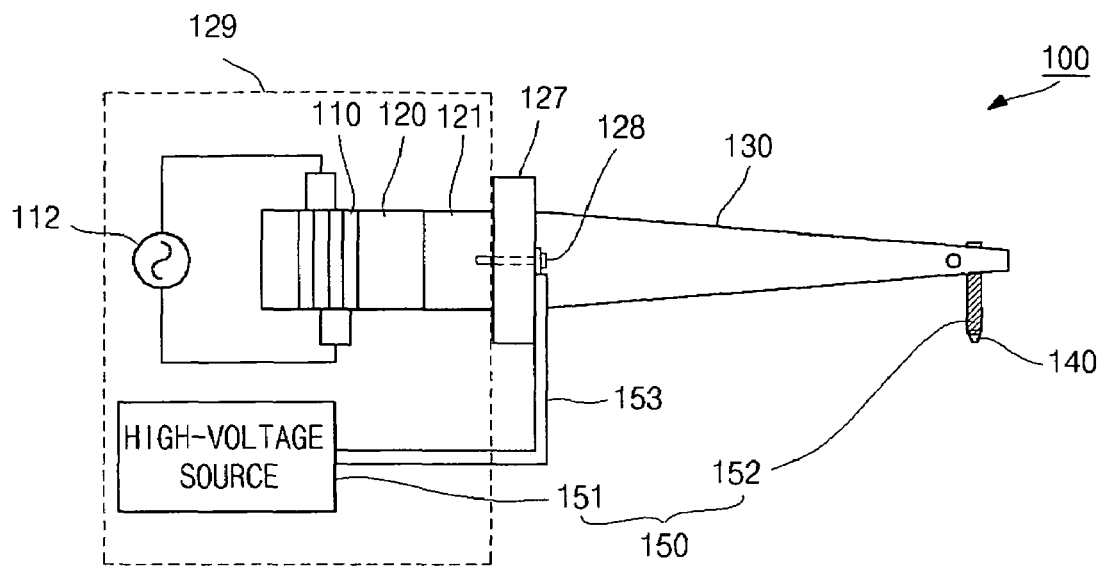
FIG. 1 is a schematic side view of a transducer assembly according to the present invention.

FIG. 1 schematically illustrates a transducer assembly according to the present invention.

As shown in FIG. 1, a transducer assembly 100 according to the present invention includes a vibrator 110, a transducer body 120, a horn 130, a capillary 140 and a discharge member 150 moving together with the horn 130. Here, the vibrator 110 and the transducer body 120 may be assembled with the bond head 129 by a bolt 128 provided at a flange 127 formed integrally with the horn 130. Of course, the bond head 129 is the portion fixed to the wire bonder.

The vibrator 110 generates ultrasonic wave energy for wire bonding. The vibrator 110 is coupled to a high-frequency oscillator 112 for generating ultrasonic wave.

The transducer body 120 is coupled on one end to the vibrator 110. Thus, the ultrasonic wave generated by the vibrator 110 is transferred through the transducer body 120 to the horn 130.

The horn 130 is coupled to a second end of the transducer body 120 and is tapered (that is, its diameter reduces as the horn extends toward its tip), so that the ultrasonic wave energy can be concentrated on the tip of the horn.

The capillary 140 is a member through which the wire is inserted to actually perform the wire bonding. The capillary 140 is coupled to the tip of the horn 130 and is coated with a conductive layer 152.

The discharge member 150 includes the high-voltage source 151 and the conductive layer 152 coated on the capillary 140. The high-voltage source 151 is coupled to a predetermined portion of the transducer assembly 100 or the wire bonder. The high-voltage source 151 applies a voltage of approximately 2-5 KV and is connected through a wire 153 to the flange 127 formed integrally with the horn 130. The wire 153 may be assembled with the flange 127 by the bolt 128. The location to which the wire 153 is fixed is not limited.

An insulating block 121 may be interposed between the transducer body 120 and the flange 127 in order to prevent a high voltage from being applied from the horn 130 to the transducer body 120. Of course, even when the insulating block 121 is interposed between the transducer body 120 and the flange 127, the ultrasonic wave can be easily transferred from the transducer body 120 to the horn 130. However, the high voltage is prevented from being transferred from the high-voltage source 151 toward the transducer body 120. The horn 130 and the flange 127 may be made from conductive material in order to easily transfer the high voltage from the high voltage source 151 to the conductive layer 152 of the capillary 140. The horn 130 and the flange 127 may be made from duralumin, aluminum alloy, tungsten, carbide or their equivalents. It should be noted that the listing of the above materials should not be seen as to limit the scope of the present invention. Other materials mat be used without departing from the spirit and scope of the present invention.

Figure 1A:
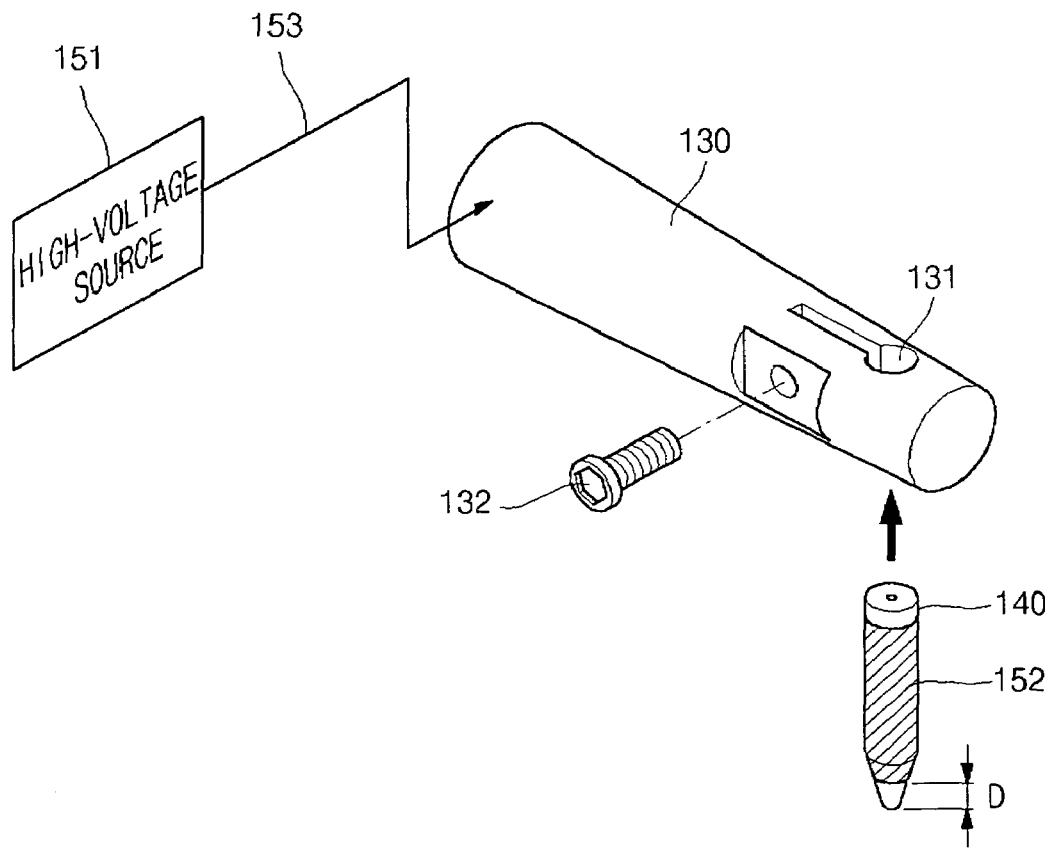
FIG. 1A is a schematic exploded perspective view of the transducer assembly of FIG. 1.
Figure 1B:
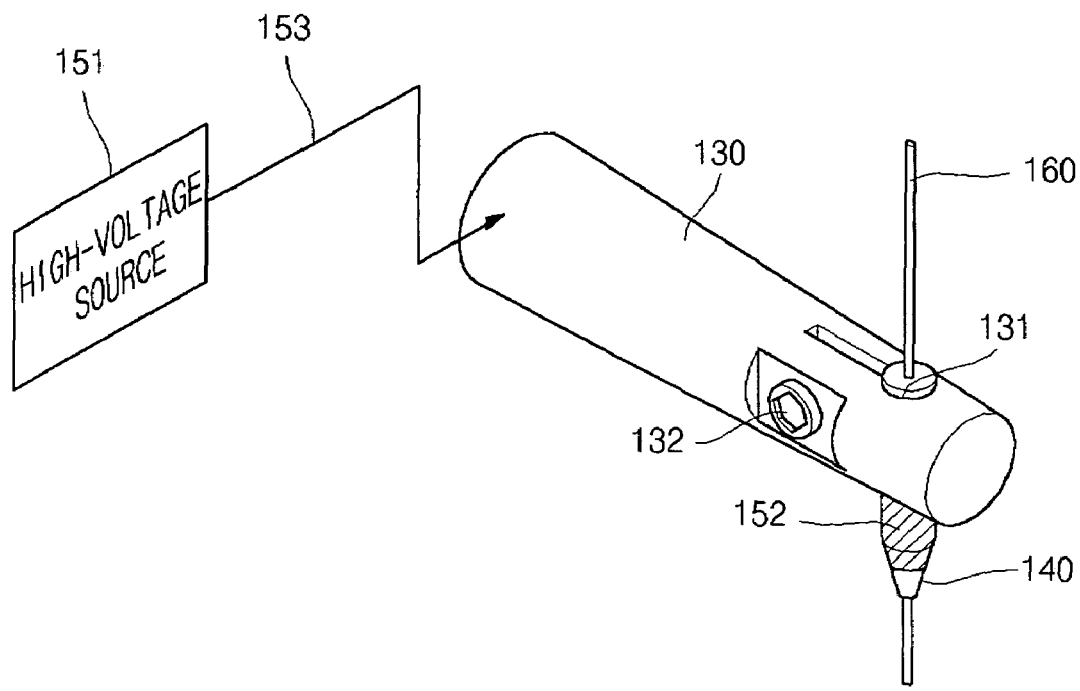
FIG. 1B is a perspective view of the transducer assembly in which the capillary has been assembled with the horn.
Figure 1C:
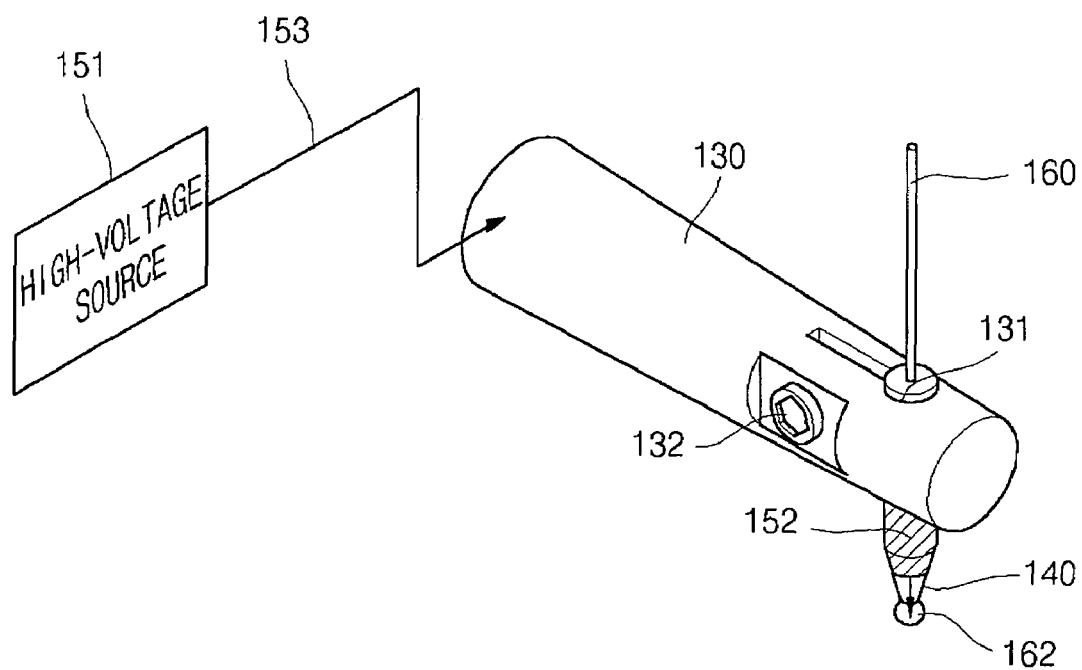
FIG. 1C is a perspective view of the transducer assembly in which a ball has been formed on a lower end of a wire by discharge.

As shown in FIG. 1A, a capillary hole 131 for holding the capillary 140 is formed near the tip of the horn 130. A bolt 132 is assembled through a side surface of the horn 130 to fasten the capillary hole 131 in order to prevent the capillary 140 fitted in the capillary hole 131 from being separated from the capillary hole 131. The high-voltage source 151 of the discharge member 150 is connected to the horn 130 through the wire 153. The shape of the capillary hole 131 shown in FIGS. 1A through 1C is only shown as an example. The shape of the capillary hole 131 is not limited to that shown in FIGS. 1A through 1C. It should be noted that the bolt 132 for fastening the capillary hole may be omitted.

The conductive layer 152 of the discharge member 150 may be coated on the surface entirely around the capillary 140. It is preferred to form the conductive layer 152 on a portion of the capillary 140 with predetermined spaces from the top and bottom of the capillary. The reason to form the conductive layer 152 a predetermined distance from the top of the capillary 140 is to prevent a discharge flame generated by the high voltage of the high-voltage source 151 from being transferred to the wire located at the top of the capillary 140. The high voltage from the high-voltage source 151 is transferred to the wire through the horn 130 and the conductive layer 152, and the discharge flame is transferred to the wire through an area nearest to the wire. In other words, if the conductive layer 152 is formed up to the top of the capillary 140, the discharge flame may be transferred to the wire above the capillary 140 through the conductive layer 152 formed on the top portion of the capillary 140. Also, by forming the conductive layer 152 with a predetermined distance from the lower end of the capillary 140, the high voltage from the high-voltage source 151 is not directly conducted to the wire at the lower end of the capillary 140 but can be transferred to the wire in the form of discharge flame. The distance between the lower end of the conductive layer 152 and the wire located at the lower end of the capillary 140 is smaller than the distance between the top of the conductive layer 152 and the wire located at the top of the capillary 140. It is preferred that the distance D between the lower end of the conductive layer 152 and the lower end of the capillary 140 is approximately 10~20 mil. When the distance D between the lower end of the conductive layer 152 and the lower end of the capillary 140 is maintained at around 10~20 mil, it is possible to achieve a ball with a desired size and a desired spherical shape. The conductive layer 152 may be formed by not only coating but also non-electrolyte plating, electrolyte plating, sputtering, and their equivalent methods. It should be noted that the method for forming the conductive layer 152 on the capillary 140 is not limited to the above mentioned methods.

Further, it is preferred that the conductive layer 152 is made from a material sufficiently resistant to high voltage and discharge flame. For example, the conductive layer 152 may be made from one selected from the group consisting of tungsten W, molybdenum Mo, rhodium Rh, vanadium V, zirconium Zr, chromium Cr, platinum Pt, titanium Ti, nickel Ni, copper Cu, gold Au, silver Ag and palladium Pd or from their alloy. However, it should be noted that the present invention is not limited to such materials.

As shown in FIG. 1B, the capillary 140 is assembled in the capillary hole 131 of the horn 130. The bolt 132 is inserted through the side surface of the horn 130 to fasten the capillary 140, thereby preventing the capillary 140 from being separated from the horn 130. The capillary 140 has a wire 160 inserted downward through the capillary 140 from the top thereof.

As shown in FIG. 1C, the high voltage from the high-voltage source 151 is transferred in the form of discharge flame through the horn 130 and the conductive layer 152 coated on the capillary 140 to the wire 160 at the lower end of the capillary 140. Then, the wire 160 at the lower end of the capillary 140 is instantly molten and forms a spherical ball 162 due to surface tension. After the ball 162 is formed on the wire 160 as described above, the transducer assembly 100 performs ball bonding either on a bond pad of a semiconductor die or on an electrically conductive pattern of a substrate.

Figure 1D:
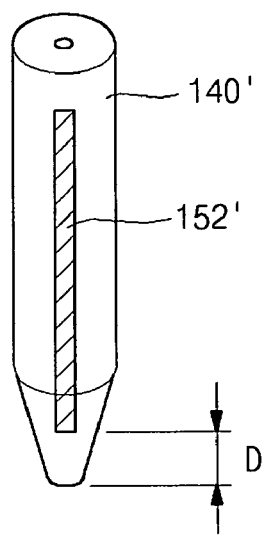
FIG. 1D is a perspective view of another capillary.

As shown in FIG. 1D, the conductive layer 152' formed on the capillary 140' may have a predetermined width and may be formed in a substantially linear shape along the lengthwise direction of the capillary 140'. Of course, in this case, the conductive layer 152' is formed only on a portion having upper and lower ends apart from the top and bottom of the capillary 140', respectively. Further, the distance between the lower end of the conductive layer 152' and the lower end of the capillary 140' is also arranged to be approximately 10~20 mil, so that a ball having a desired shape and size can be formed at the lower end of the capillary.

Figure 1E:
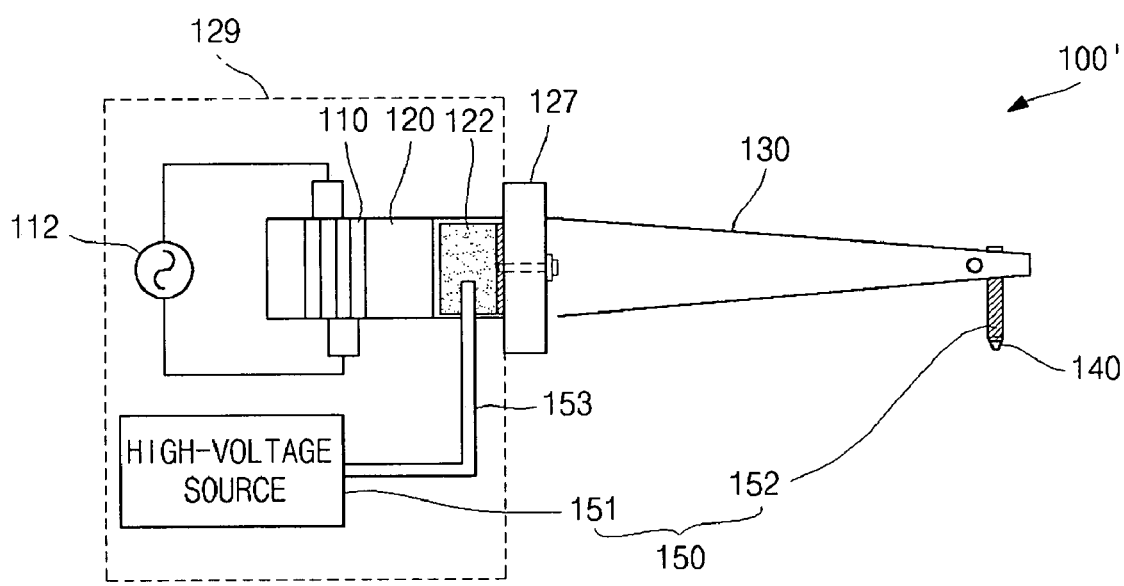
FIG. 1E is a schematic side view of another transducer assembly.

As shown in FIG. 1E, the transducer assembly 100' may further include a mercury block 122. Specifically, the mercury block 122 may be positioned between the transducer body 120 and the flange 127. The wire 153 from the high-voltage source 151 is coupled to the mercury block 122. This structure can transfer the high voltage from the high-voltage source 151 to the flange 127 and the horn 130 without interruption. That is, when the wire 153 is directly coupled to the flange 127 without the mercury block 122, the fast vibration of the horn 130 may degrade the electric connection between the wire 153 and the flange 127. However, in the case where the voltage from the high-voltage source 151 is transferred through the mercury block 122 to the horn or flange as described above, even when the mercury block 122 vibrates at a high speed, the mercury block 122 remains in contact with the flange 127 and can transfer the high voltage to the horn or flange without problems.

Figure 2:
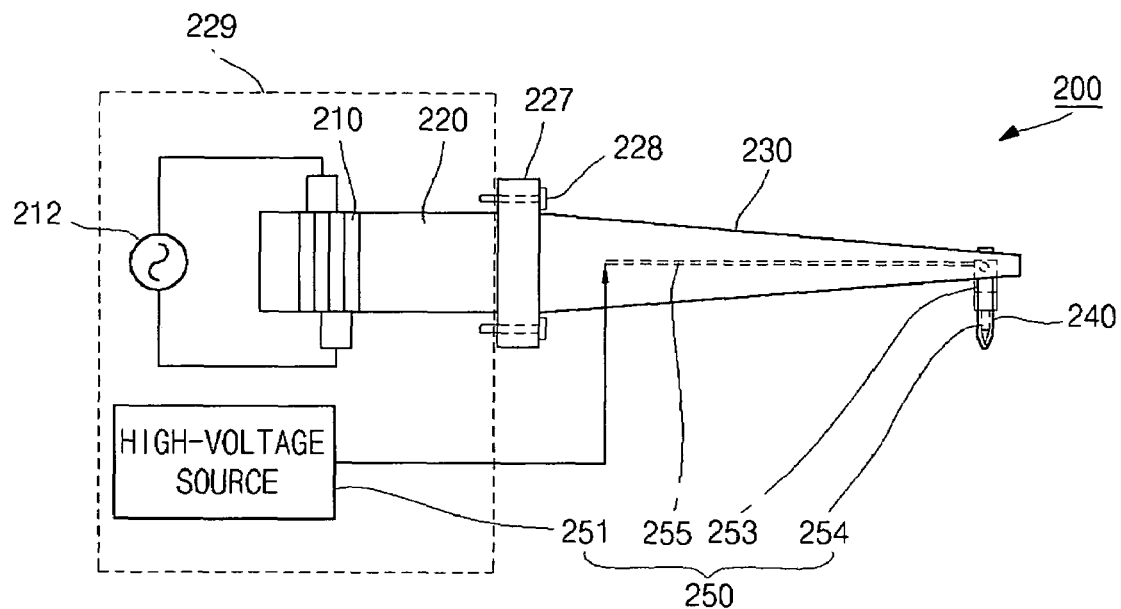
FIG. 2 schematically illustrates a transducer assembly according to another embodiment of the present invention.

FIG. 2 schematically illustrates a transducer assembly according to another embodiment of the present invention.

As shown in FIG. 2, the transducer assembly 200 includes a vibrator 210, a transducer body 220, a horn 230, a capillary 240 and a discharge member 250 moving together with the horn 230. The vibrator 210, the transducer body 220 and the horn 230 are similar to those in the transducer assembly 100 of FIG. 1, so description thereof is omitted here.

The discharge member 250 includes a high-voltage source 251, a discharge tip 252 (which includes a bracket 253 and a discharge blade 254 (FIGS. 2A and 2B)) and a wire 255.

Figure 2A:
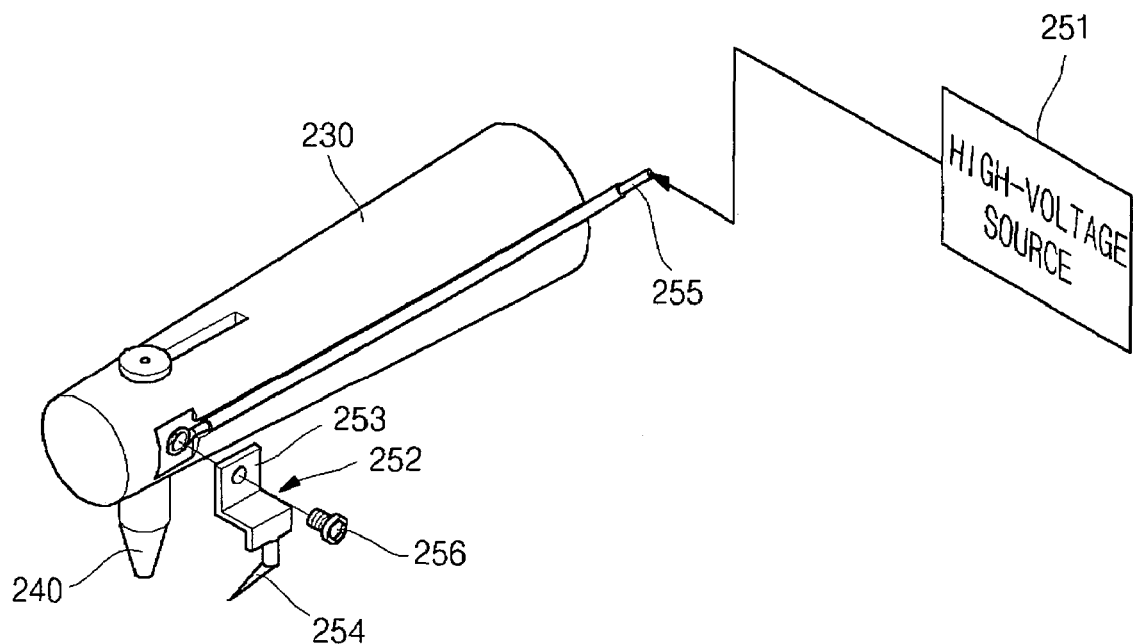
FIG. 2A is a schematic exploded perspective view of the transducer assembly of FIG. 2.
Figure 2B:
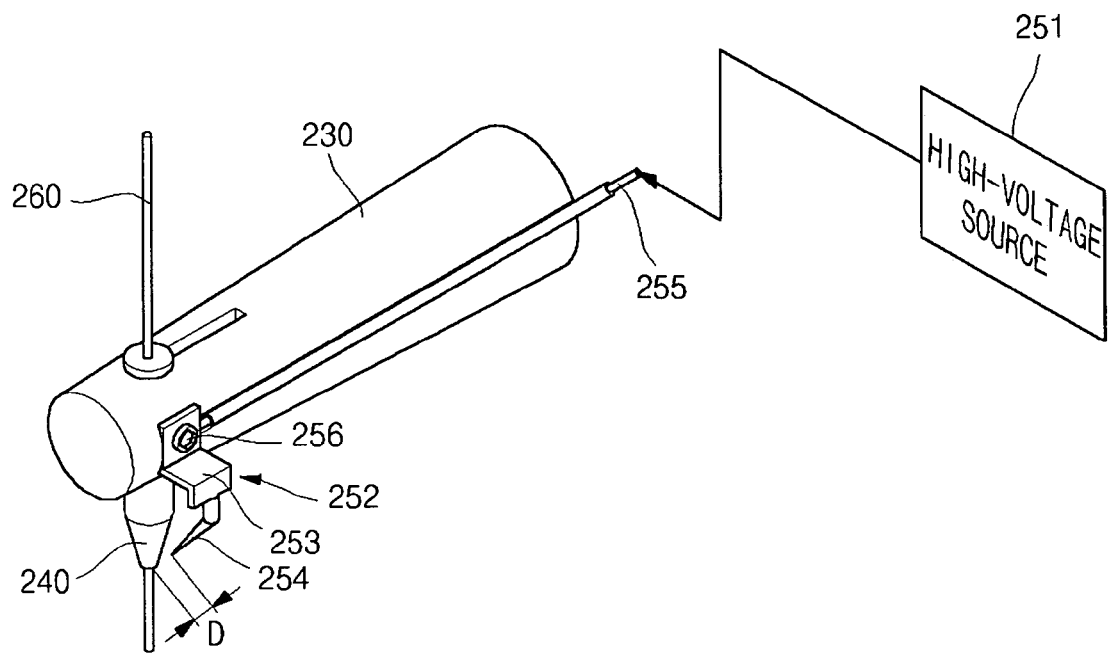
FIG. 2B is a perspective view of the transducer assembly in which the capillary and the discharge tip have been assembled with the horn.

As shown in FIGS. 2A and 2B, the discharge tip 252 of the discharge member 250 may be directly coupled with the horn 230. The discharge tip 252 may be coupled to the high-voltage source 251 through a wire 255. The wire 255 may be either seated in a groove with a predetermined depth formed on the horn 230 or simply coupled to the surface of the horn 230 without a groove. In order to prevent the wire 255 from being separated from the horn 230, the horn 230 and the wire 255 may be wrapped by a tape. Further, the wire 255 is coated with insulating resin, to prevent the wire 255 from being in contact with the horn 230.

In the meantime, when the transducer assembly 200 includes a separate discharge tip 252 as described above, it is unnecessary to interpose an insulating block between the transducer body 220 and the horn 230 as is in the previous embodiment. It is because the high voltage from the high-voltage source 251 is transferred through the wire 255 directly to the discharge tip 252 without passing through the horn 230. Furthermore, it is unnecessary to make the horn 230 always from a conductive material. That is, the horn 230 may be made from insulating material, such as common ceramic, ruby or their equivalents, to which the insulating material is not limited.

The discharge tip 252 of the discharge member 250 may include a conductive bracket 253 and a conductive discharge blade 254 formed at a lower end of the bracket 253. The discharge blade 254 has a pointed end. The bracket 253 of the discharge tip 252 is assembled with the side surface of the horn 230 by a bolt 256 and is electrically coupled to the wire 255. Here, when the horn 230 is made from conductive material, an insulating gasket may be interposed between the horn 230 and the bracket 253 in order to prevent electric contact between them. The discharge blade 254 formed at the lower end of the bracket 253 has a pointed end extending toward the capillary 240 assembled with the horn 230. In order not to disturb the wire bonding by the capillary 240, the discharge blade 254 is arranged in such a manner that the pointed end of the discharge blade 254 is located somewhat higher than the lower end of the capillary 240. Moreover, it is preferred that the distance D between the pointed end of the discharge blade 254 and the lower end of the capillary 240 is approximately 10~20 mil. Such a distance D between the pointed end of the discharge blade 254 and the lower end of the capillary 240 can form a ball having the best size and shape on the wire.

Figure 2C:
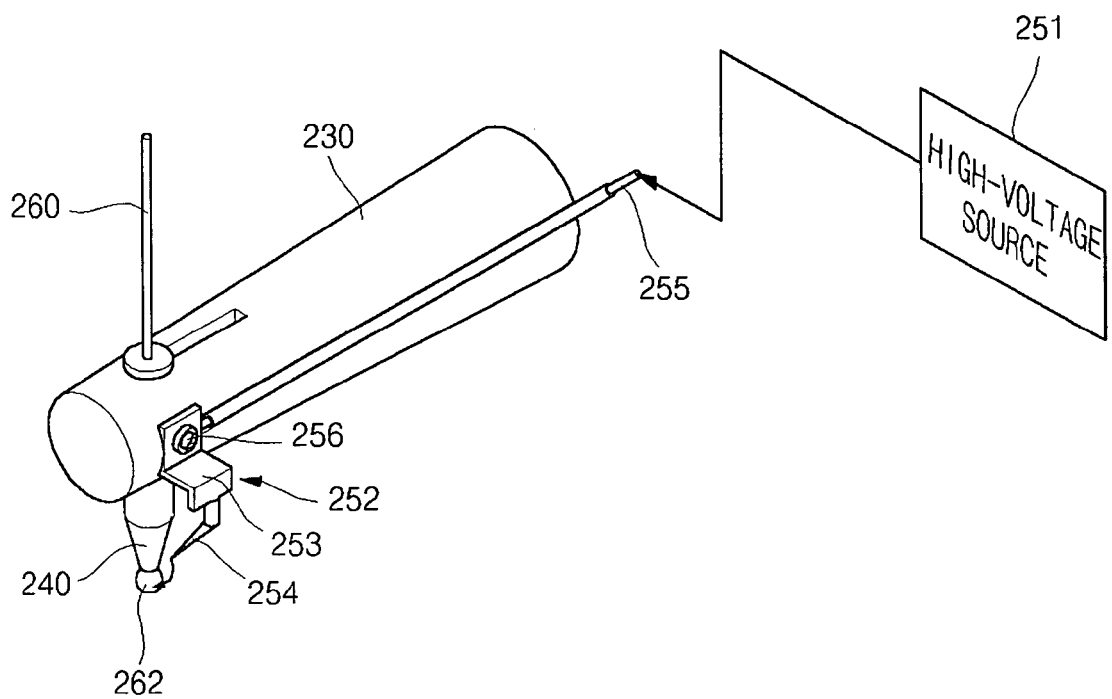
FIG. 2C is a perspective view of the transducer assembly in which a ball has been formed on a lower end of a wire by discharge.

Referring to FIG. 2C, the discharge tip 252 moving together with the horn 230 operates when forming a ball 262 on the wire 260 for the first ball bonding and/or the second ball bonding. That is, the high voltage from the high-voltage source 251 constituting the discharge member 250 is transferred along the wire 255 to the discharge tip 252. In other words, the high voltage from the high-voltage source 251 is first transferred to the bracket 253 and the discharge blade 254 constituting the discharge tip 252, and discharge flame from the discharge blade 254 is then transferred to the wire 260 at the lower end of the capillary 240. As a result, a substantially spherical ball 262 is formed at the lower end of the capillary 240. Naturally, after the ball 262 is formed, the first ball bonding or the second ball bonding may be performed by the movement of the horn 230.

Figure 2D:
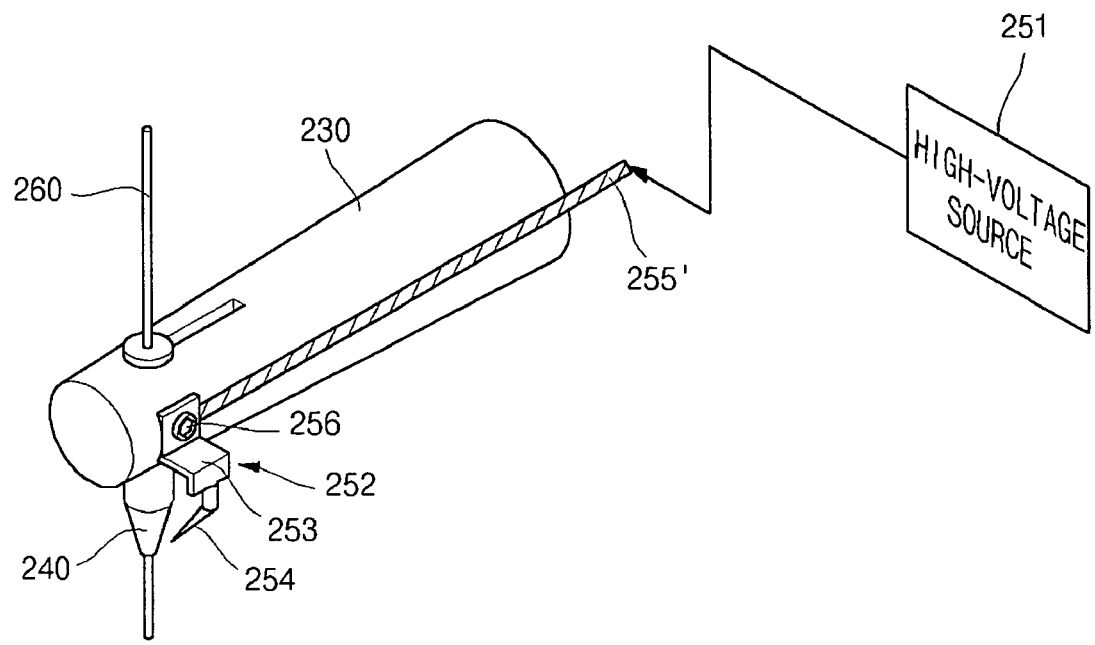
FIG. 2D is a perspective view of a transducer assembly according to another embodiment of the present invention.

As shown in FIG. 2D, the high-voltage source 251 and the discharge tip 252 may be interconnected through a conductive ink strip 255' formed on the surface of the horn instead of the wire. In this case, the horn 230 must be made from insulating material. However, by using the conductive ink strip 255', the high-voltage source 251 and the discharge tip 252 can be interconnected in a relatively simple manner.

Figure 3A:
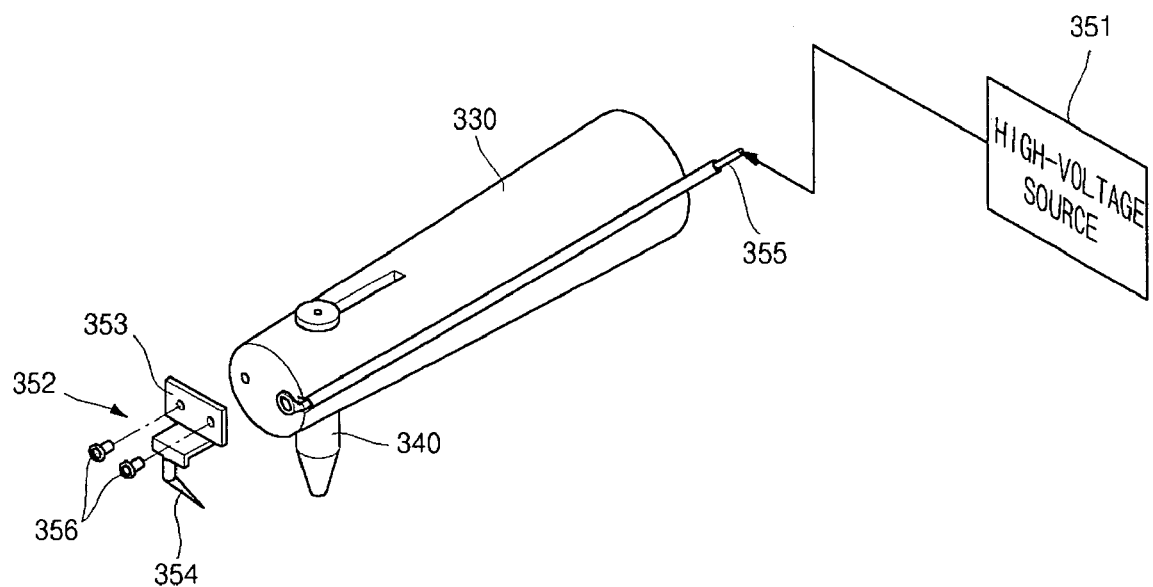
FIG. 3A is a schematic exploded perspective view of the transducer assembly according to another embodiment of the present invention.
Figure 3B:
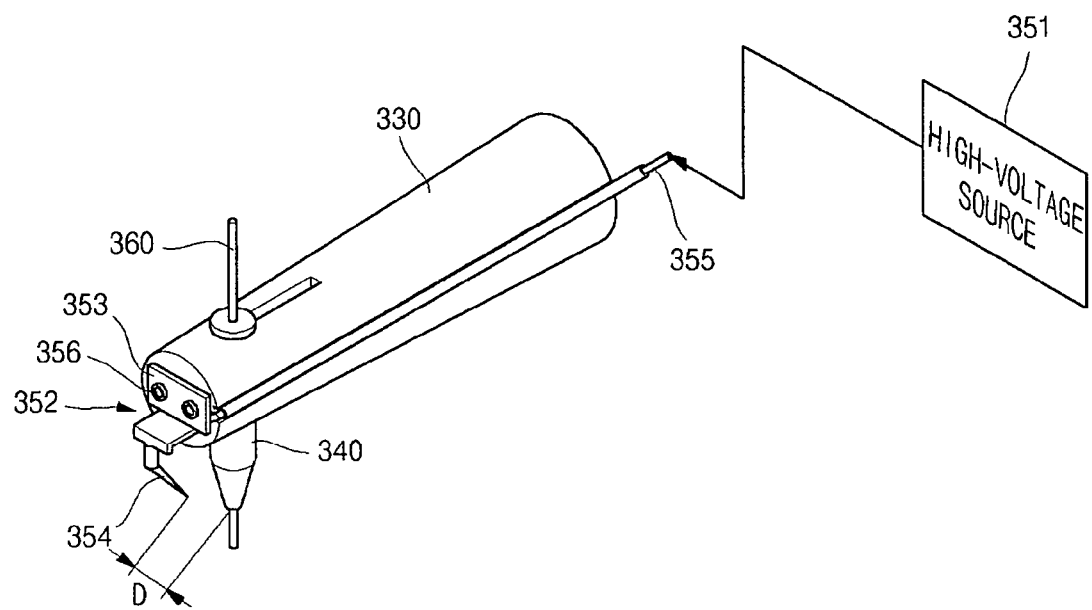
FIG. 3B is a perspective view of the transducer assembly in which the capillary and the discharge tip have been assembled with the horn.

As shown in FIGS. 3A and 3B, the discharge tip 352 of the discharge member 350 may be coupled to a front end of the horn 330. The discharge tip 352 may also include a bracket 353 and a conductive discharge blade 354 formed integrally at a lower end of the bracket 353. The discharge blade 354 has a pointed end. The bracket 353 is coupled to the front end of the horn 330 by a bolt 356 and is electrically coupled through the wire 355 to the high-voltage source 351.

Figure 3C:
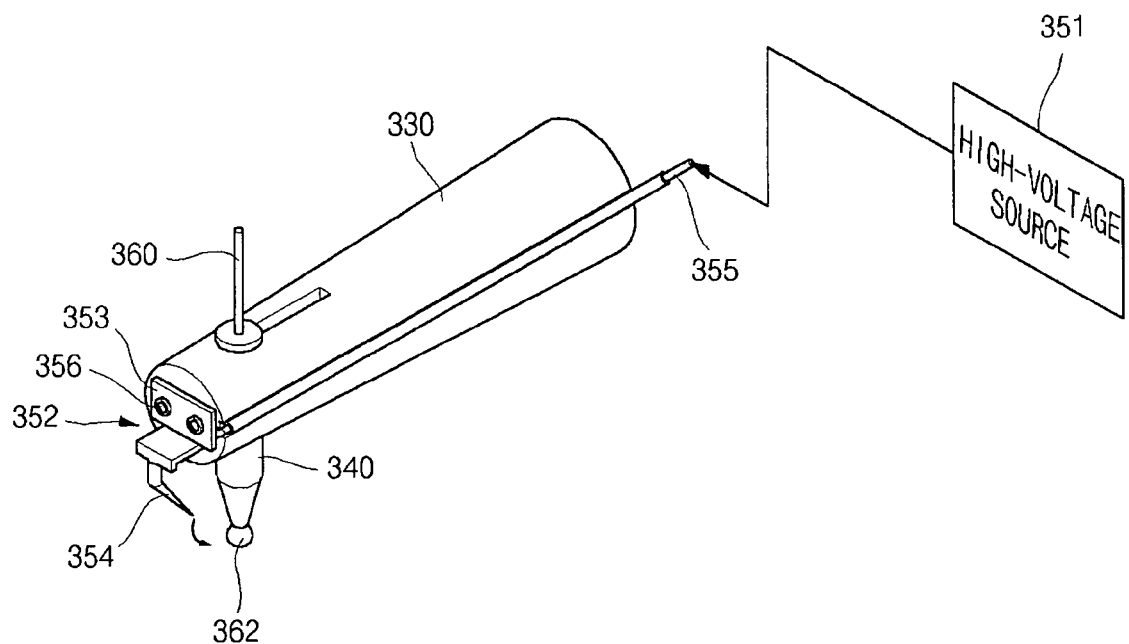
FIG. 3C is a perspective view of the transducer assembly in which a ball has been formed on a lower end of a wire by discharge.

Referring to FIG. 3C, the discharge tip 352 moving together with the horn 330 operates when forming a ball 362 on the wire 360 for the first ball bonding and/or the second ball bonding. That is, the high voltage from the high-voltage source 351 constituting the discharge member 350 is transferred along the wire 355 to the discharge tip 352. In other words, the high voltage is transferred in the form of discharge flame through the bracket 353 and the discharge blade 354 constituting the discharge tip 352 to the wire 360 at the lower end of the capillary 340. A substantially spherical ball 362 is formed at the lower end of the capillary 340. Of course, after the ball 362 is formed, the first ball bonding or the second ball bonding may be performed by the movement of the horn 330. Moreover, it is preferred that the distance D between the pointed end of the discharge blade 354 and the lower end of the capillary 340 is approximately 10~20 mil. Such a distance D between the pointed end of the discharge blade 354 and the lower end of the capillary 340 can form a ball having the best size and shape on the wire.

Figure 4A:
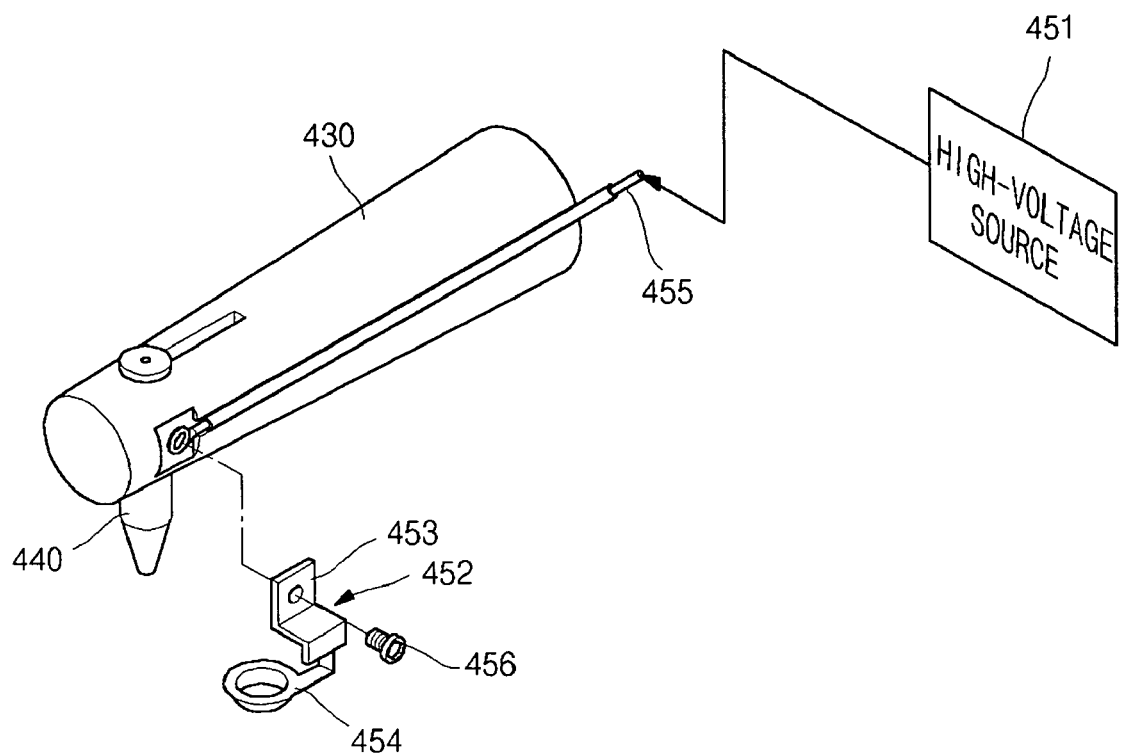
FIG. 4A is a schematic exploded perspective view of the transducer assembly according to another embodiment of the present invention.
Figure 4B:
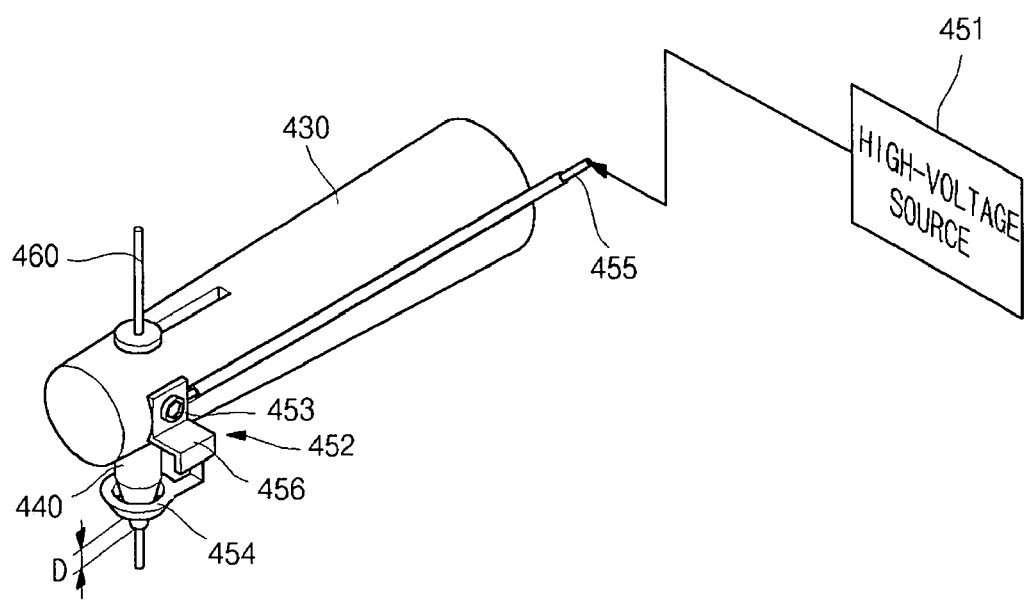
FIG. 4B is a perspective view of the transducer assembly in which the capillary and the discharge tip have been assembled with the horn.

As shown in FIGS. 4A and 4B, the discharge tip 452 of the discharge member 450 may be coupled to a side surface (or a front end) of the horn 430. The discharge tip 452 may include a bracket 453 and a conductive discharge blade 454 formed integrally at a lower end of the bracket 453. The discharge blade 454 has a ring shape. The bracket 453 is coupled to the side surface of the horn 430 by a bolt 456 and is electrically coupled through the wire 455 to the high-voltage source 451.

Figure 4C:
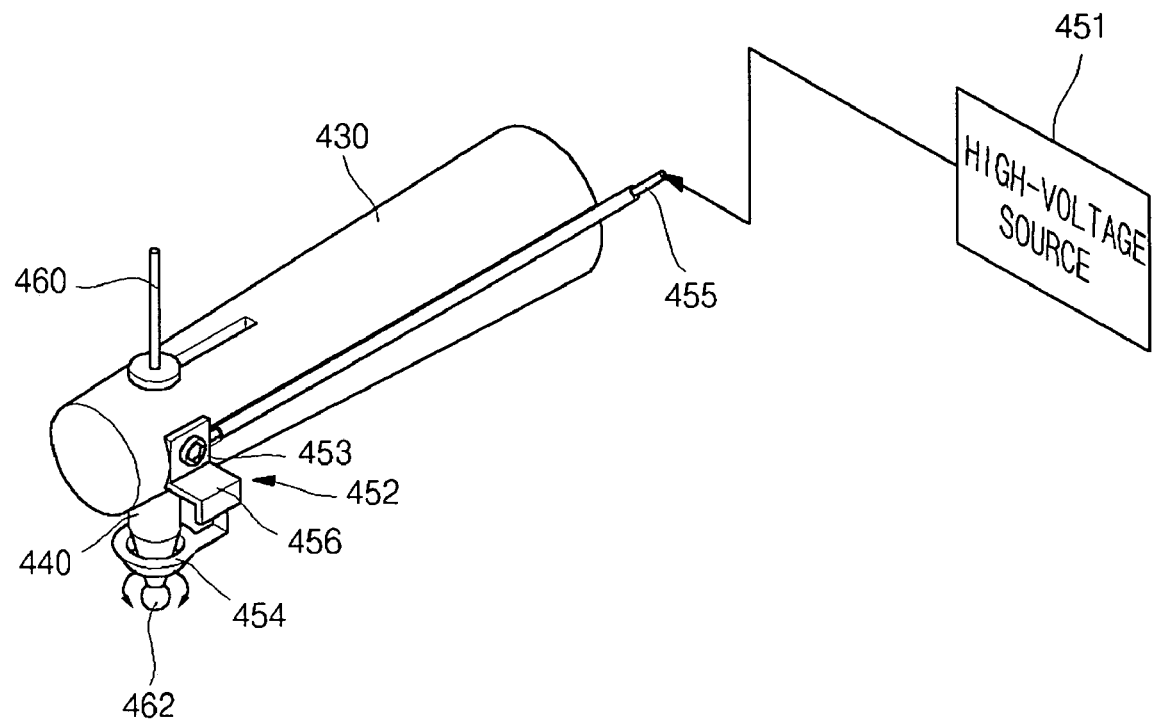
FIG. 4C is a perspective view of the transducer assembly in which a ball has been formed on a lower end of a wire by discharge.

Referring to FIG. 4C, the discharge tip 452 moving together with the horn 430 operates when forming a ball 462 on the wire 460 for the first ball bonding and/or the second ball bonding. That is, the high voltage from the high-voltage source 451 constituting the discharge member 450 is transferred along the wire 455 to the discharge tip 452. In other words, the high voltage is transferred in the form of discharge flame through the bracket 453 and the discharge blade 454 constituting the discharge tip 452 to the wire 460 at the lower end of the capillary 440. Then, a substantially spherical ball 462 is formed at the lower end of the capillary 440. Of course, after the ball 462 is formed, the first ball bonding or the second ball bonding is performed by the movement of the horn 430. Moreover, it is preferred that the distance D between the pointed end of the discharge blade 454 and the lower end of the capillary 440 is approximately 10~20 mil. Such a distance D between the pointed end of the discharge blade 454 and the lower end of the capillary 440 can form a ball having the best size and shape on the wire.

Figure 5A:
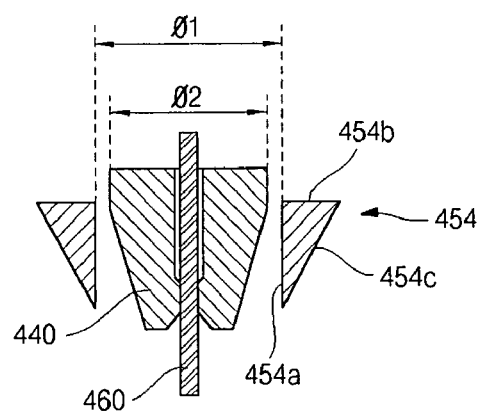
FIG. 5A is a sectional view of the discharge blade and the capillary shown in FIGS. 4A through 4C.
Figure 5B:
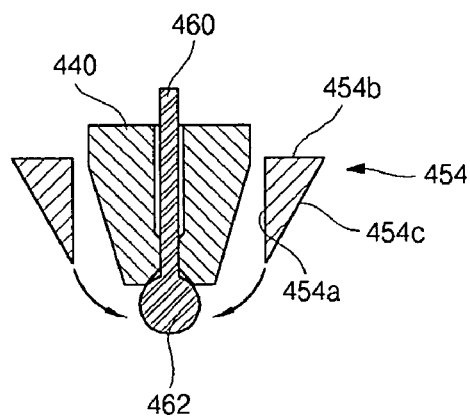
FIG. 5B is a sectional view of the discharge blade and the capillary with a wire having a ball formed at a lower end thereof.

FIG. 5A is a sectional view of the discharge blade and the capillary shown in FIGS. 4A through 4C and FIG. 5B is a sectional view of the discharge blade and the capillary with a wire having a ball formed at a lower end thereof.

As shown, the discharge blade 454 constituting the discharge tip has a shape of a substantial ring surrounding the capillary 440. However, the discharge blade 454 has a diameter $\Phi 1$ larger than the diameter $\Phi 2$ of the capillary 440, so that the discharge blade 454 and the capillary 440 are not in contact with each other. Further, the discharge blade 454 having a ring shape is placed slightly higher than the lower end of the capillary 440, so as not to disturb the bonding of the wire 460 by the capillary 440.

The discharge blade 454 of the discharge tip 452 has a sectional shape like an inverted triangle. Specifically, the discharge blade 454 has a first side 454a substantially parallel to the lengthwise direction of the capillary 440, a second side 454b substantially perpendicular to the lengthwise direction, and a third side 454c slantly extending between the first side 454a and the second side 454b. Of course, the first side 454a and the third side 454c make a predetermined angle, and an angular point between the first side 454a and the third side 454c is located nearest to the wire 460. Therefore, the high voltage is transferred in the form of discharge flame to the wire 460 through the angular point between the first side 454a and the third side 454c of the discharge blade 454 shaped like a ring.

Figure 6A:
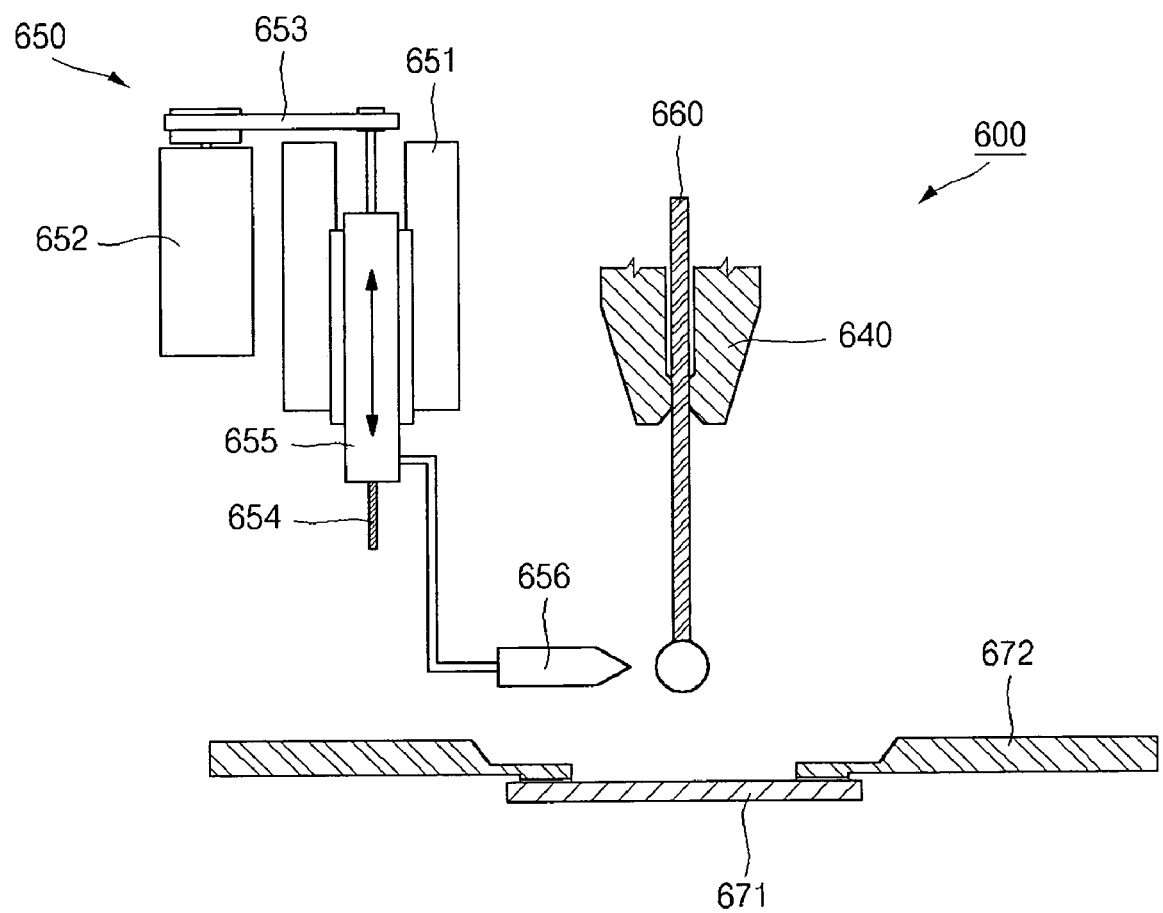
FIG. 6A is a schematic side view of a transducer assembly according to another embodiment of the present invention.

Referring to FIG. 6A, the transducer assembly 600 according to another embodiment of the present invention may include a capillary 640 and a discharge member 650. A wire 660 is inserted through the capillary 640 and can move up and down in the capillary 640 for the first ball bonding and/or the second ball bonding. The discharge member 650 moves up and down together with the capillary 640, so as to provide discharge flame to the wire 660.

The discharge member 650 may include a body 651, a motor 652, a belt 653, a ball screw 654, a moving block 655 and a discharge blade 656. The body 651 can hold various structural objects. The motor 652 is disposed outside of the body 651. The ball screw 654 is disposed at one side (e.g. inside) of the body 651 and is connected through the belt 653 to the motor 652 so that it can rotate in a predetermined direction. The moving block 655 is assembled with the ball screw 654 and moves up and down while being guided by the body 651. The discharge blade 656 is assembled with the moving block 655 and provides discharge flame to the wire 660 at the lower end of the capillary 640. Here, the body 651 holding various structural objects is assembled with a wire bonder (not shown) so that it can move along the same trace as that of the wire bonder. That is to say, the wire bonder moves, for example, in the horizontal direction along the periphery of the semiconductor die. Here, the body 651 (i.e. the discharge member 650) also may move in the horizontal direction together with the wire bonder.

Reference numerals 671 and 672 not described above denote a substrate and a clamp for clamping the substrate, respectively.

According to the above structure, when the motor 652 rotates in a predetermined direction, the belt 653 wound on the motor 652 also rotates in the predetermined direction. Then, the ball screw 654 also wound by the belt 653 rotates in the corresponding direction and the moving block 655 assembled therewith moves up or down a predetermined distance along the body 651. The discharge blade 656 assembled with the moving block 655 also moves up or down along the body 651. Of course, the discharge blade 656 moves up and down in the same direction as the capillary 640 moves.

Figure 6B:
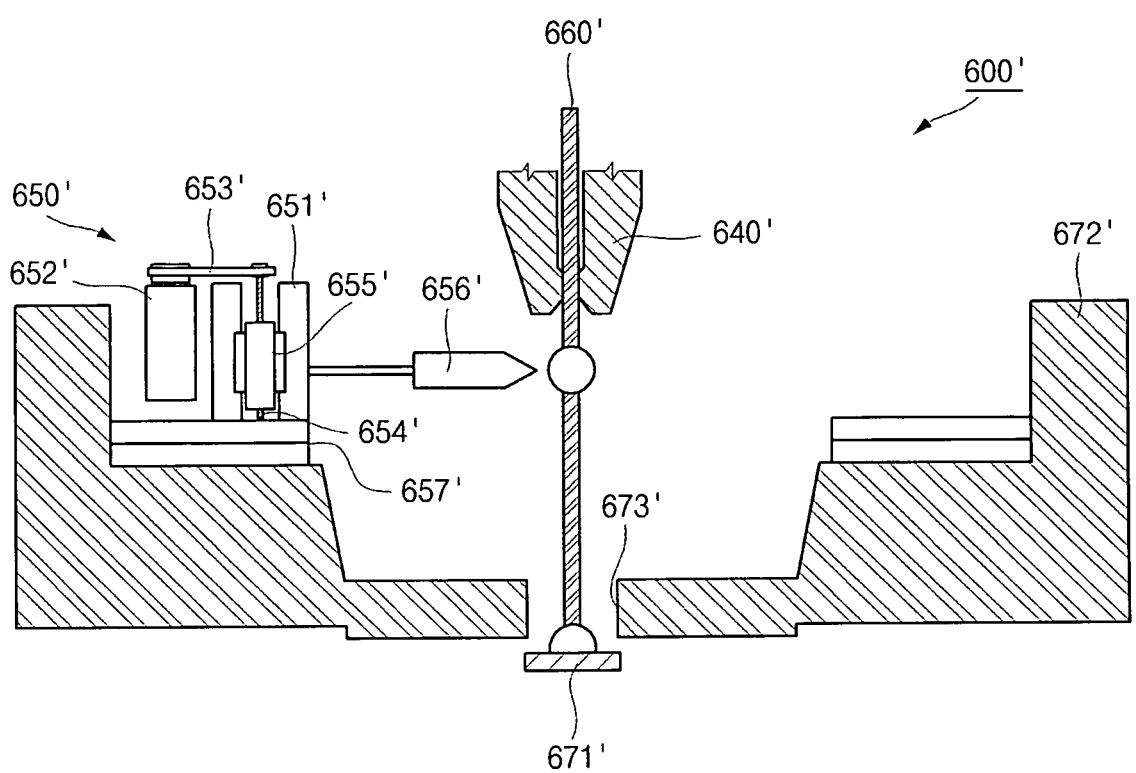
FIG. 6B is a schematic side view of a transducer assembly according to still another embodiment of the present invention.

Referring to FIG. 6B, the transducer assembly 600' according to another embodiment of the present invention may include a clamp 672', a capillary 640' and a discharge member 650'. The clamp 672' has a window 673' which exposes predetermined areas of the semiconductor die and the substrate 671'. A wire 660' is inserted through the capillary 640' and can move up and down in the capillary 640' so that the first ball bonding and/or the second ball bonding can be performed within the window 673'.

The discharge member 650' may include a body 651', a motor 652', a belt 653', a ball screw 654', a moving block 655' and a discharge blade 656'. The motor 652' is disposed outside of the body 651'. The ball screw 654' is disposed inside of the body 651' and is connected through the belt 653' to the motor 652' so that it can rotate in a predetermined direction. The moving block 655' is assembled with the ball screw 654' and moves up and down while being guided by the body 651'. The discharge blade 656' is assembled with the moving block 655' and provides discharge flame to the wire 660' at the lower end of the capillary 640'.

Here, the body 651' holding various structural objects (i.e. the discharge member 650') may be arranged in such a manner that it can move in the horizontal direction along the periphery of window 673'. That is to say, the wire bonder including the capillary 640' moves in the horizontal direction along the periphery of window 673' of the clamp 672'. Here, the wire bonder moves along the same trace as that of the discharge member 650'. In order to achieve this movement, an XY table 657' holding the discharge member 650' may be installed at the periphery of window 673' of the clamp 672'.

According to the above structure, when the motor 652' rotates in a predetermined direction, the belt 653' wound on the motor 652' also rotates in the predetermined direction. Then, the ball screw 654' also wound by the belt 653' rotates in the corresponding direction and the moving block 655' assembled therewith moves up or down a predetermined distance along the body 651'. Then, the discharge blade 656' assembled with the moving block 655' also moves up or down together. Here, it is natural that the discharge blade 656' moves up and down in the same direction as the capillary 640' moves. The horizontal movement of the discharge member 650' is carried out by the XY table 657' installed at the clamp 672'.

Figure 7A:
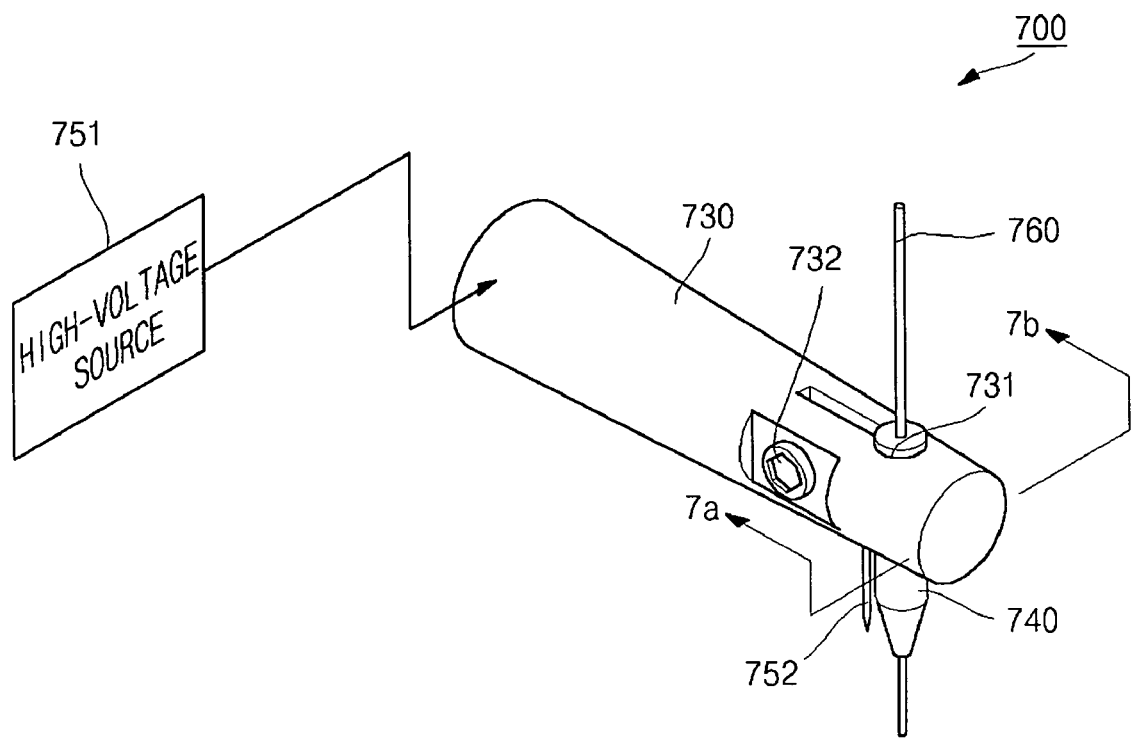
FIG. 7A is a perspective view of a transducer assembly according to another embodiment of the present invention.

Referring to FIG. 7A, a capillary hole 731 is formed near the tip of a conductive horn 730 so that a non-conductive capillary 740 can be inserted and assembled in the capillary hole 731. Further, a bolt 732 is assembled through a side surface of the horn 730 to fasten the capillary hole 731 in order to prevent the capillary 740 fitted in the capillary hole 731 from being separated from the capillary hole 731. Of course, the high-voltage source 751 is connected to the horn 730 through a wire.

Meanwhile, a discharge tip 752 is disposed at one side of the capillary 740 near the tip of the horn 730. The discharge tip 752 is assembled with the horn 730 while extending substantially in parallel to the capillary 740 and has a lower end slightly higher than the lower end of the capillary 740. That is, the length of the discharge tip 752 extending downward from the horn is smaller than the length of the capillary 740 extending downward from the horn. Therefore, while the capillary 740 performs wire bonding, the discharge tip 752 does not contact another wire nor disturb the wire bonding. It is preferred that the distance D between the lower end of the discharge tip 752 and the lower end of the capillary 740 is approximately 10~20 mil. When such a distance D of about 10~20 mil is maintained between the lower end of the discharge tip 752 and the lower end of the capillary 740, a ball having a desired size and shape can be formed on the wire.

It is preferred that the discharge tip 752 is made from a material sufficiently resistant to high voltage and discharge flame. For example, the discharge tip 752 may be made from one selected from the group consisting of tungsten W, molybdenum Mo, rhodium Rh, vanadium V, zirconium Zr, chromium Cr, platinum Pt, titanium Ti, nickel Ni, copper Cu, gold Au, silver Ag and palladium Pd or from their alloy. However, the present invention is not limited to such materials.

Figure 7B:
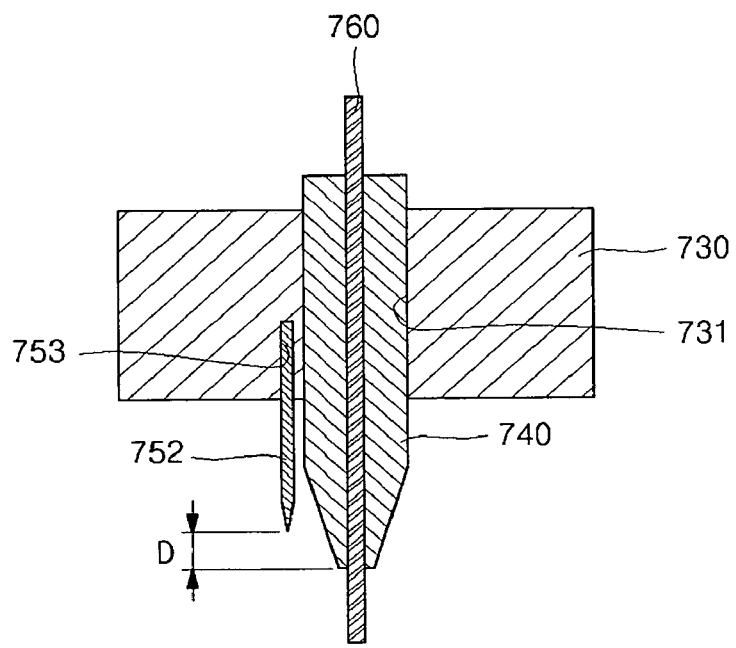
FIG. 7B is a sectional view taken line 7-7 of FIG. 7A.

Referring to FIG. 7B, the capillary hole 731 for holding the capillary 740 is formed near the tip of the horn 730 and a groove 753 for holding the discharge tip 752 is formed at one side of the capillary hole 731. Of course, both the discharge tip 752 and the horn 730 are made from conductive material and the capillary 740 is made from insulating material.

The length of the discharge tip 752 extending downward from the horn is smaller than the length of the capillary 740 extending downward from the horn. Therefore, the discharge tip 752 does not disturb the wire bonding by the capillary 740.

Although the discharge tip 752 has a shape of a rod in the drawings, the present invention is not limited to the shown rod shape. In other words, the discharge tip 752 may have any shape capable of transferring the discharge flame to the wire 760 extending downward through the capillary 740 out of the lower end thereof, which includes shapes of a fishhook, a letter "C", etc.

Figure 8:
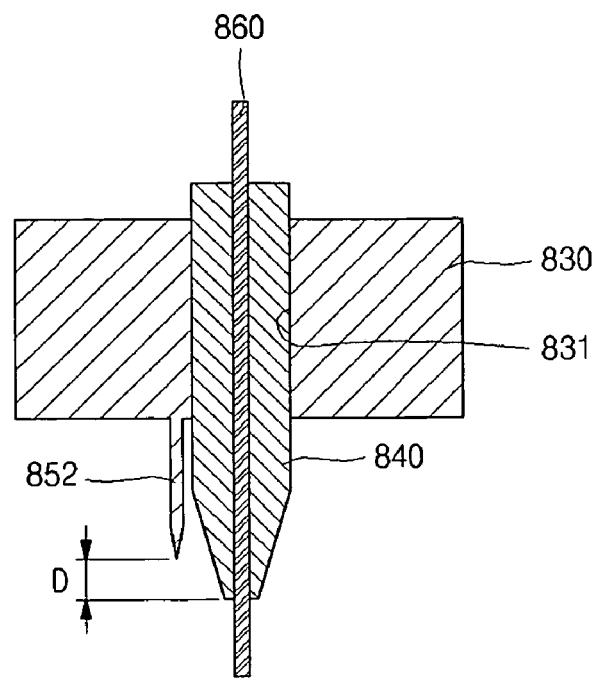
FIG. 8 is a sectional view of a transducer assembly according to another embodiment of the present invention.

FIG. 8 is a sectional view of a transducer assembly according to another embodiment of the present invention. As shown, the discharge tip 852 may be formed integrally with the horn 830. Of course, both discharge tip 852 and the horn 830 are made from conductive material. Also, the discharge tip 852 extends downward with a predetermined length substantially in parallel to the capillary 840. Further, the length of the discharge tip 852 under the horn is smaller than the length of the capillary 840 under the horn, so as to prevent the lower end of the discharge tip 852 from disturbing the wire bonding. Here, reference numerals 860 and 831 denote a wire and a capillary hole, respectively. The capillary hole 831 is formed at the horn 830 so that the capillary can be fitted in the capillary hole 831. It is preferred that the distance D between the lower end of the discharge tip 852 and the lower end of the capillary 840 is approximately 10~20 mil, so as to achieve a ball having a desired size and shape formed on the wire.

Figure 9:
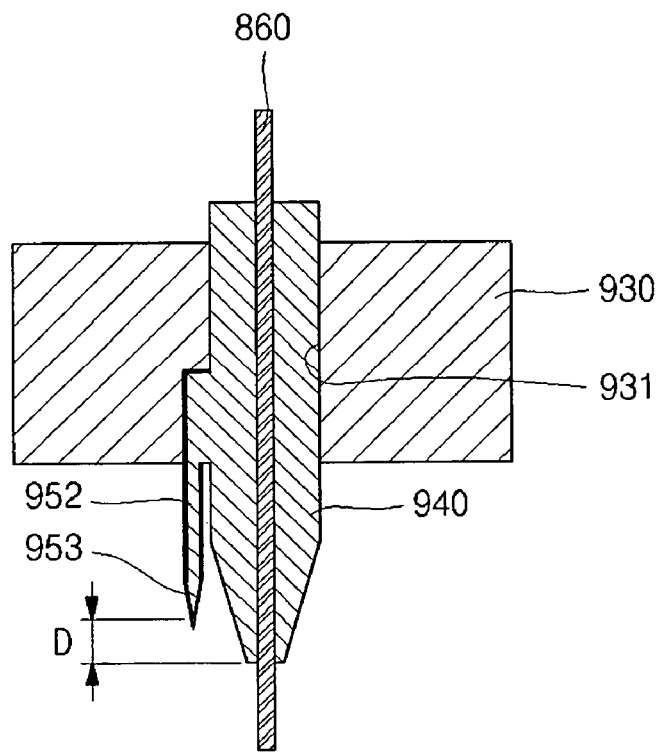
FIG. 9 is a sectional view of a transducer assembly according to another embodiment of the present invention.

FIG. 9 is a sectional view of a transducer assembly according to another embodiment of the present invention. As shown, a discharge tip 952 may be formed integrally with a capillary 940 assembled with a conductive horn 930. For example, the discharge tip 952 and the capillary 940 may be formed by sintering alloy such as alumina and zirconia. Also, the discharge tip 952 may have a surface coated with a conductive layer 953 so that discharge flame can be provided to the wire 960 at the lower end of the capillary 940.

It is preferred that the conductive layer 953 is made from a material sufficiently resistant to discharge flame. For example, the conductive layer 953 may be made from one selected from the group consisting of tungsten W, molybdenum Mo, rhodium Rh, vanadium V, zirconium Zr, chromium Cr, platinum Pt, titanium Ti, nickel Ni, copper Cu, gold Au, silver Ag and palladium Pd or from their alloy. However, the present invention is not limited to such materials. Reference numeral 931 not described above denotes a capillary hole formed through the horn 930 to hold the capillary.

Likewise, it is preferred that the distance D between the lower end of the discharge tip 952 and the lower end of the capillary 940 is approximately 10~20 mil, so as to achieve a ball having a desired size and shape formed on the wire.

Figure 10:
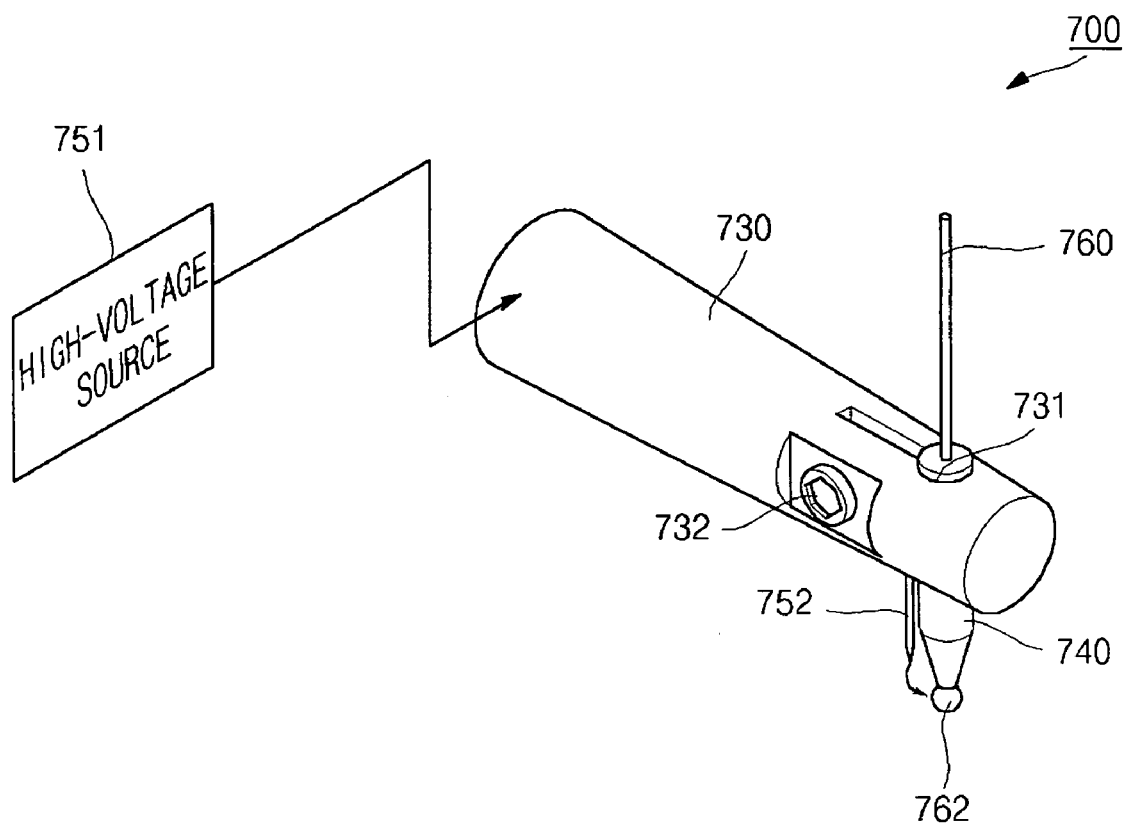
FIG. 10 illustrates a wire with a ball formed thereon by the transducer assembly shown in FIG. 7A.

FIG. 10 illustrates a wire with a ball formed thereon by the transducer assembly shown in FIG. 7A. As shown, the high voltage from the high-voltage source 751 is transferred in the form of discharge flame through the conductive horn 730 and the conductive discharge tip 752 to the wire 760 at the lower end of the capillary 740. Then, the wire 760 at the lower end of the capillary 740 is molten and forms a substantially spherical ball 762 due to surface tension. After the ball 762 is formed on the wire 760 as described above, the transducer assembly 700 performs ball bonding either on a bond pad of a semiconductor die or on an electrically conductive pattern of a substrate.

Figure 11A:
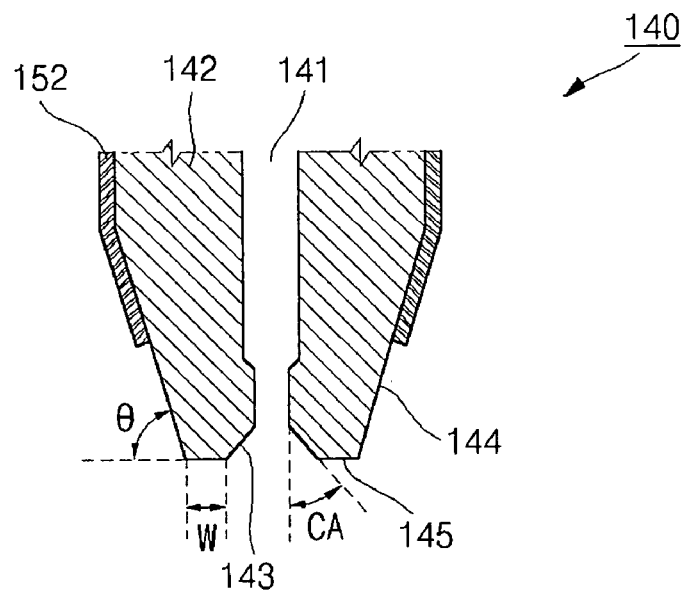
FIG. 11A is a partial sectional view of a capillary according to the present invention.
Figure 11B:
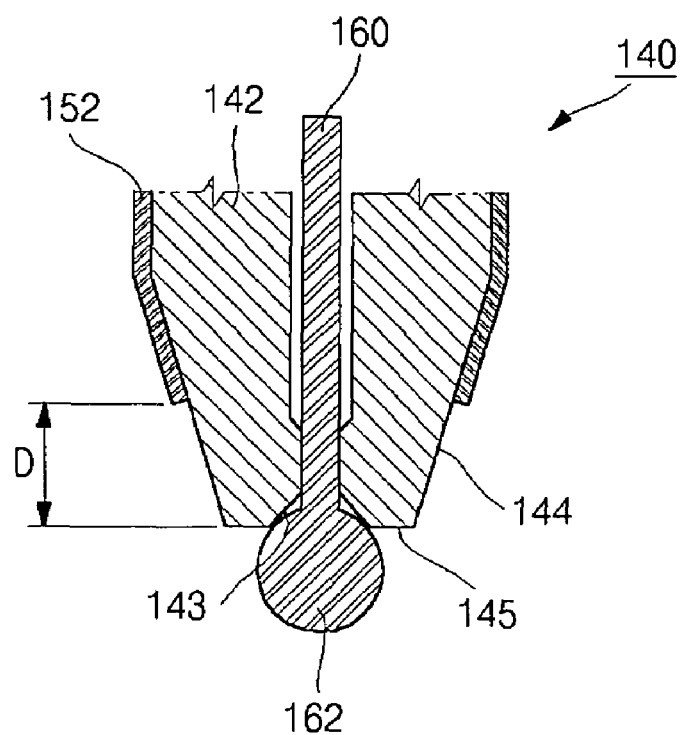
FIG. 11B is another partial sectional view of the capillary together with a ball formed on a wire by discharge flame.
Figure 11C:
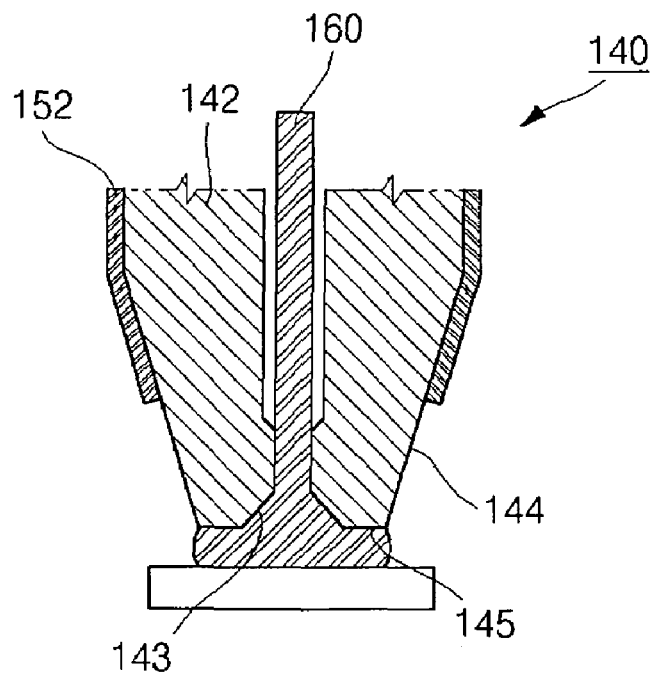
FIG. 11C is another partial sectional view of the capillary when a first ball bonding of the ball to a bond pad of a semiconductor die is performed by the capillary.

As shown in FIG. 11A through FIG. 11C, the capillary 140 according to the present invention has a capillary body 142 having a central hole 141 formed therein so that the wire 160 may be inserted in the central hole 141 through the capillary body 142. The capillary body 142 may be made from ceramic, aluminum oxide, tungsten oxide, ruby, zirconia-toughened alumina (ZTA), alumina-toughened zircon (ATZ), their equivalents, or other materials without being limited to the enumerated materials. The capillary 140 has an inner chamfer 143 formed at the lower end of the capillary body 142, which slantly extends outward at a predetermined angle with respect to the lengthwise direction of the central hole 141. Also, the capillary 140 has an outer chamfer 144 formed at the lower end of the capillary body 142, which slantly extends at a predetermined angle with respect to the lengthwise direction of the central hole 141. Further, the capillary 140 has a level surface 145 formed between the inner chamfer 143 and the outer chamfer 144 at the lower end of the capillary body 142, which extends substantially perpendicular to the lengthwise direction of the capillary body 142. Moreover, the capillary body 142 may further include a conductive layer 152 formed on its surface, which provide discharge flame when forming a ball 162 on the lower end of the wire 160. Although the conductive layer is formed on a substantially middle portion of the outer chamfer 144 in the drawing, it may be formed on a portion within a range from 10% to 90% of the entire length of the outer chamfer 144.

Here, the angle CA between the inner chamfer 143 and the central hole 141 may be approximately 0~90 degrees. The angle between the outer chamfer 144 and the level surface 145 may be approximately 0~90 degrees. That is, no round portion is formed between the outer chamfer 144 and the level surface 145, so that the capillary with as large an area as possible can squeeze the ball 162 when performing the ball bonding.

It is preferred that the distance D between the lower end of the conductive layer 152 and the lower end of the capillary 140 is approximately 10~20 mil. When such a distance D of approximately 10~20 mil is maintained between the lower end of the conductive layer 152 and the lower end of the capillary 240, a ball having a desired size and shape can be formed on the wire.

Figure 11D:
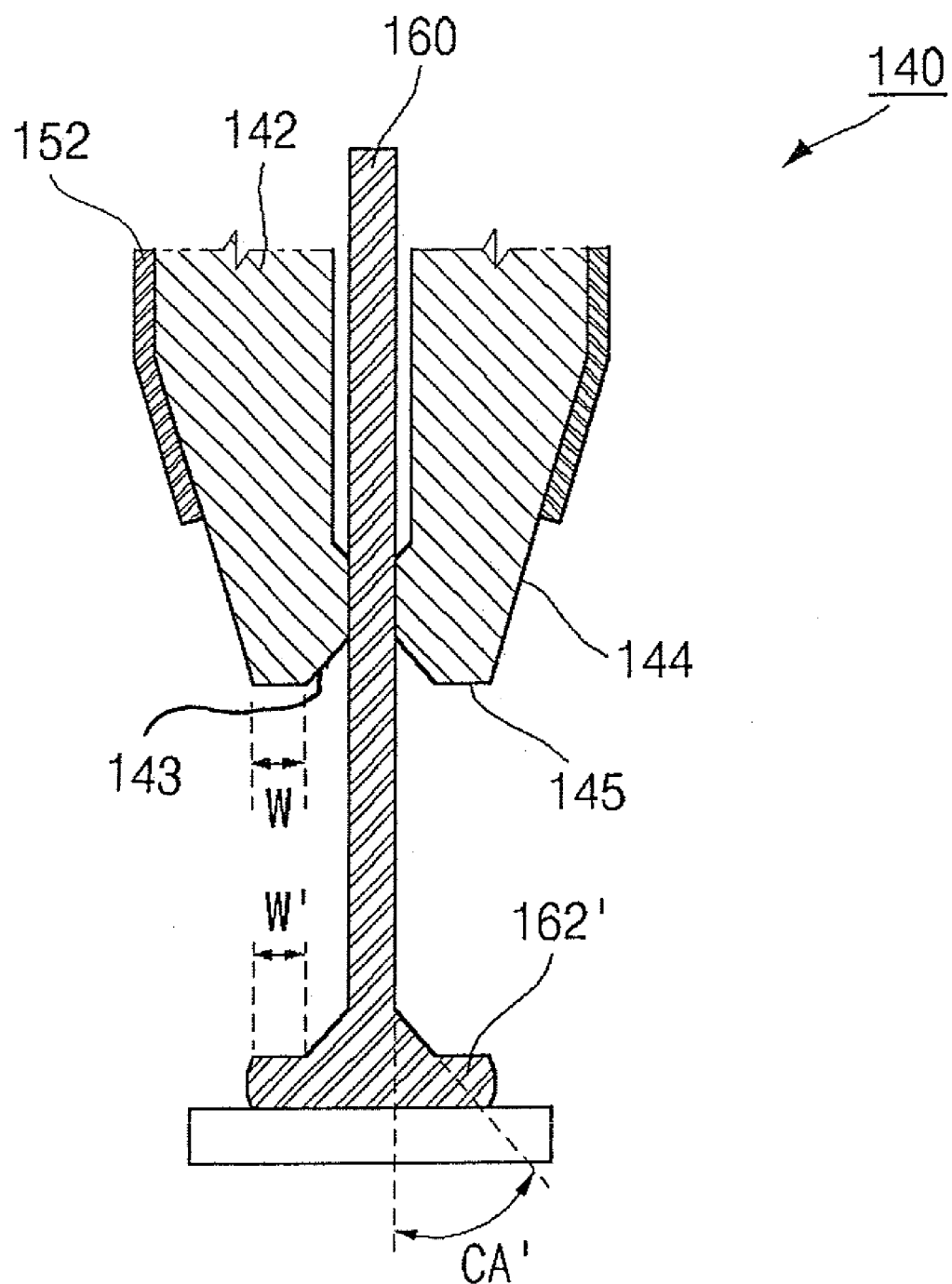
FIG. 11D is another partial sectional view of the capillary when the capillary has been moved up after the first ball bonding.

As shown in FIG. 11D, an upper portion of the ball bonding area 162' formed after the capillary 140 according to the present invention performs the wire bonding has a shape similar to that of the lower end of the capillary 140. Specifically, the area W of the level surface at the lower end of the capillary 140 is nearly the same as the area W' of the substantially level upper surface of the ball bonding area 162'. This means that the level surface of the capillary 140 presses the entire ball 162 of the wire 160 with a uniform force because there is no round portion between the level surface of the capillary 140 and the outer chamfer. Therefore, the ball bonding force of the wire 160 is further improved. Here, the chamfer angle CA' at the upper portion of the ball bonding area 162' of the wire 160 is similar to the angle CA of the inner chamfer formed on the capillary 140.

Figure 12:
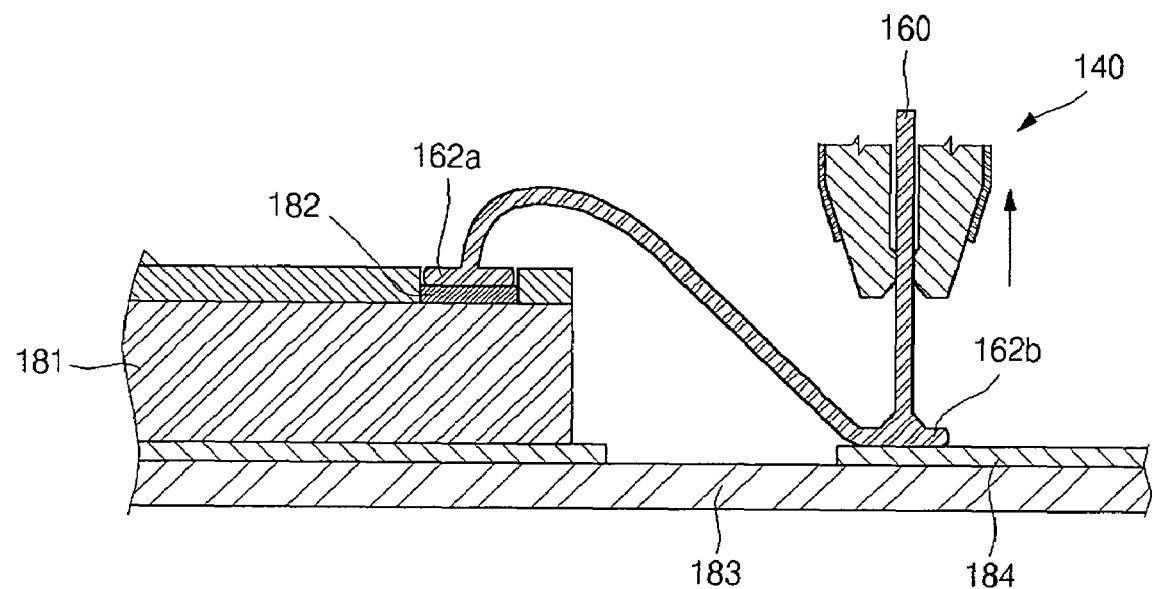
FIG. 12 is a schematic sectional view illustrating a state in which a wire is bonded to a bond pad of a semiconductor die through a first ball bonding and to an electrically conductive pattern of a substrate through a second ball bonding by a transducer assembly and a capillary according to the present invention.

FIG. 12 is a sectional view illustrating a state in which a wire is bonded to a bond pad of a semiconductor die through a first ball bonding and to an electrically conductive pattern of a substrate through a second ball bonding by a transducer assembly and a capillary according to the present invention. As shown, by the transducer assembly 100 and the capillary 140 according to the present invention, one end of the wire 160 is bonded to the bond pad 182 of the semiconductor die 181 through a first ball bonding. The other end of the wire 160 is formed with another ball which is bonded to an electrically conductive pattern 184 of a substrate 183 through a second ball bonding. After the second ball bonding, the wire 160 is cut and becomes ready for next ball bonding. Such first and second ball bondings will be described in more detail below. Reference numerals 162a and 162b not described above denote a first ball bonding area and a second ball bonding area, respectively.

Figure 13A:
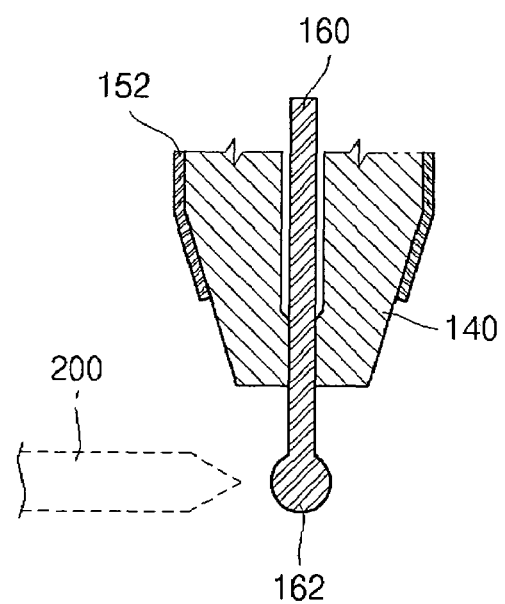
FIGS. 13A through 13O are sectional views illustrating sequential steps of a process for wire bonding by a transducer assembly and a capillary according to the present invention.
Figure 13B:
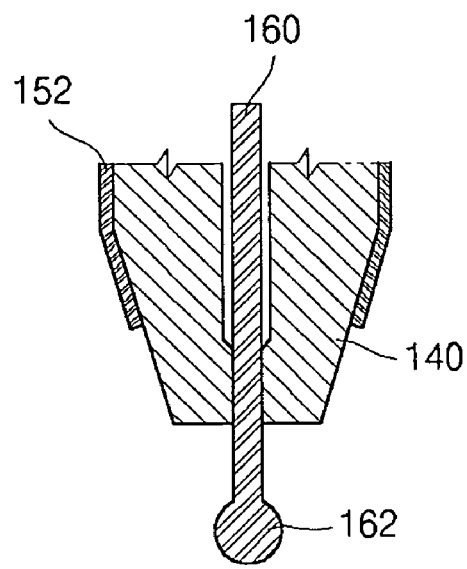
Figure 13C:
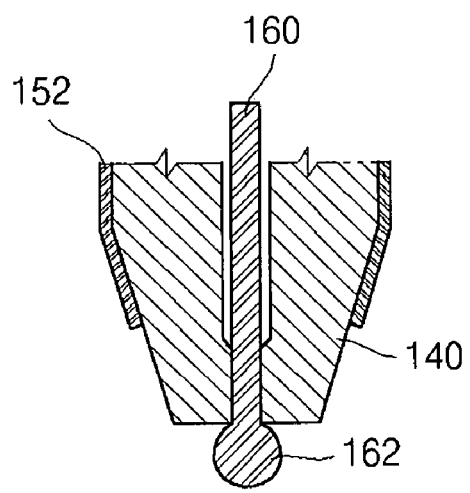
Figure 13C:
Figure 13D:
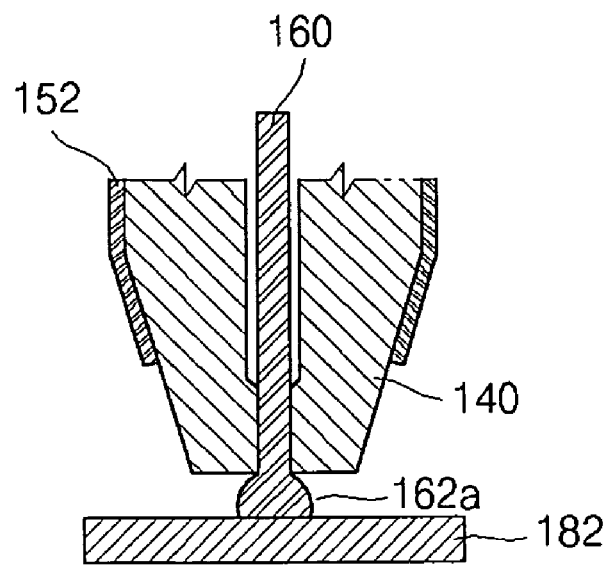
Figure 13E:
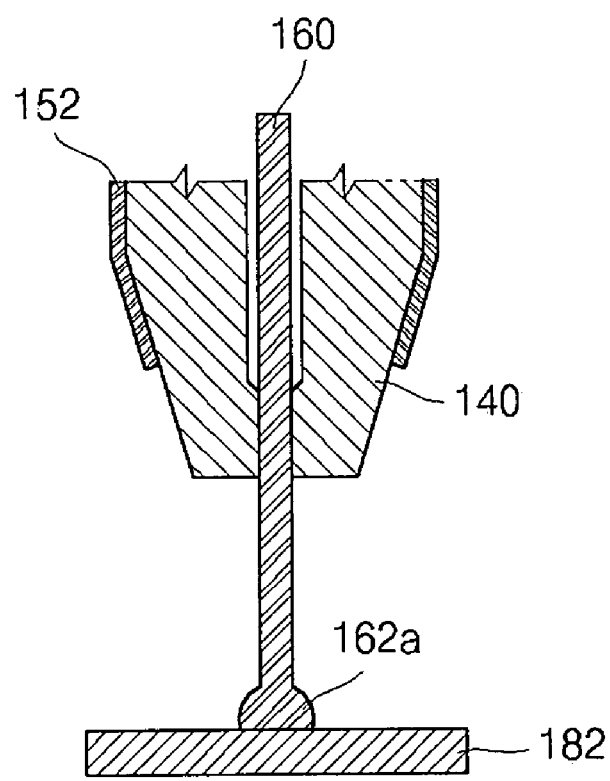
Figure 13F:
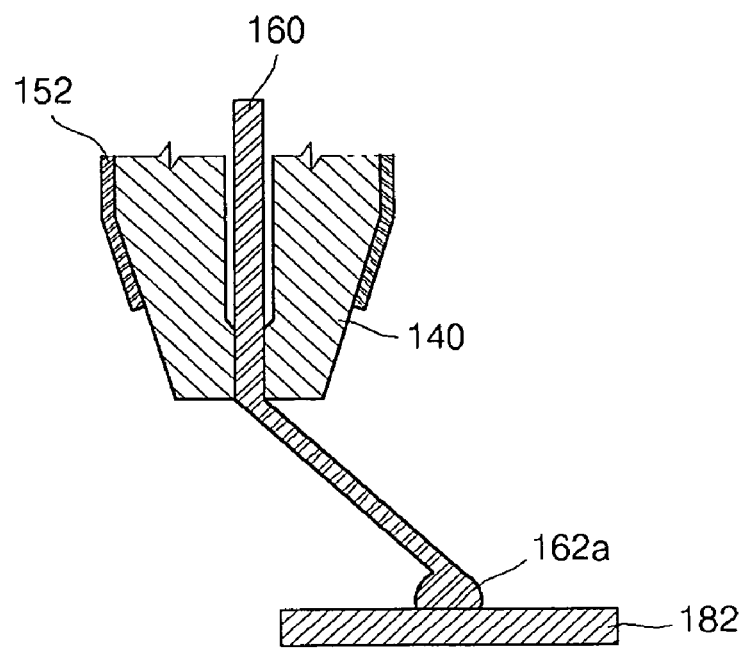
Figure 13G:
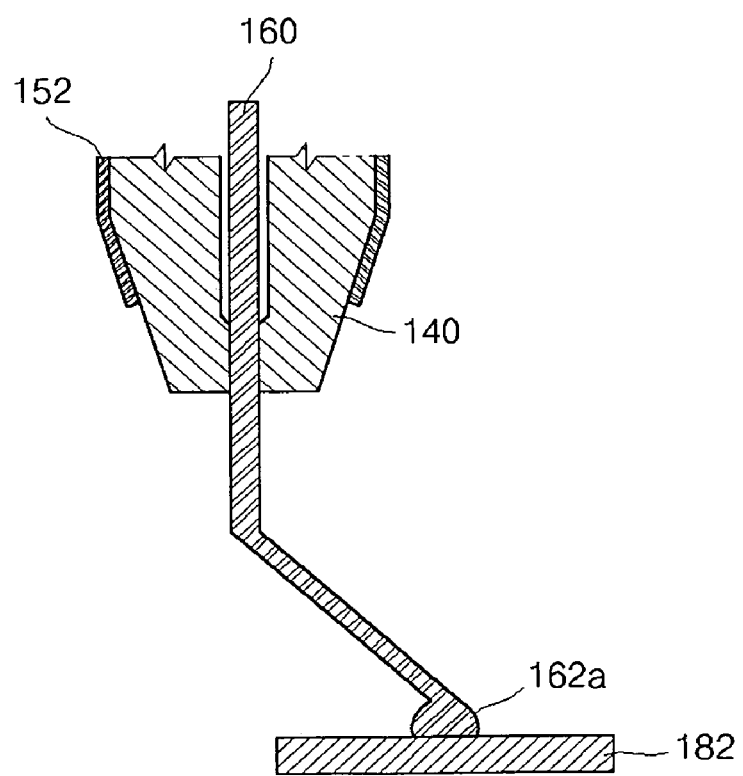
Figure 13H:
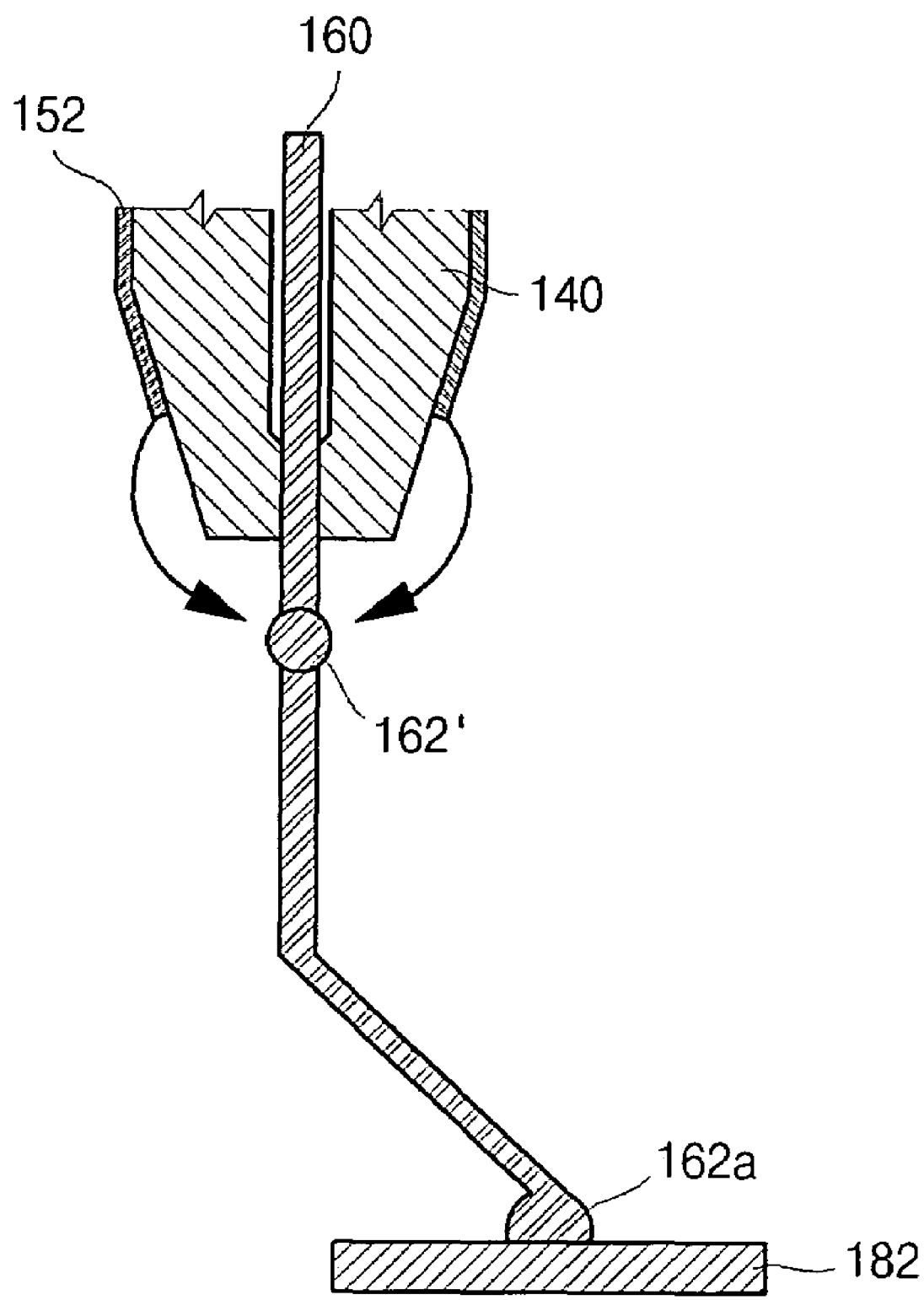
Figure 13I:
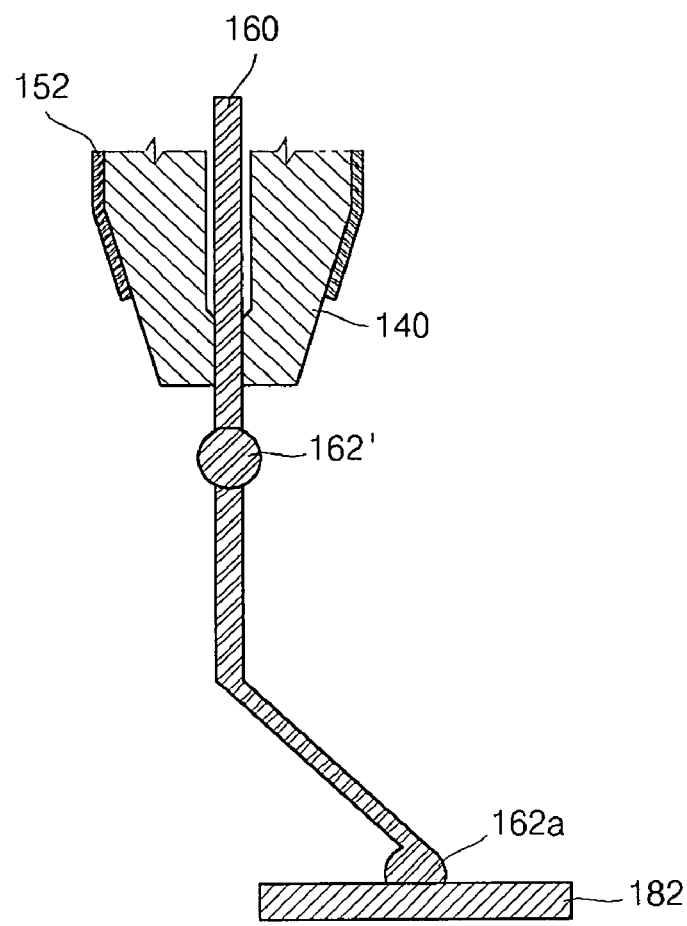
Figure 13J:
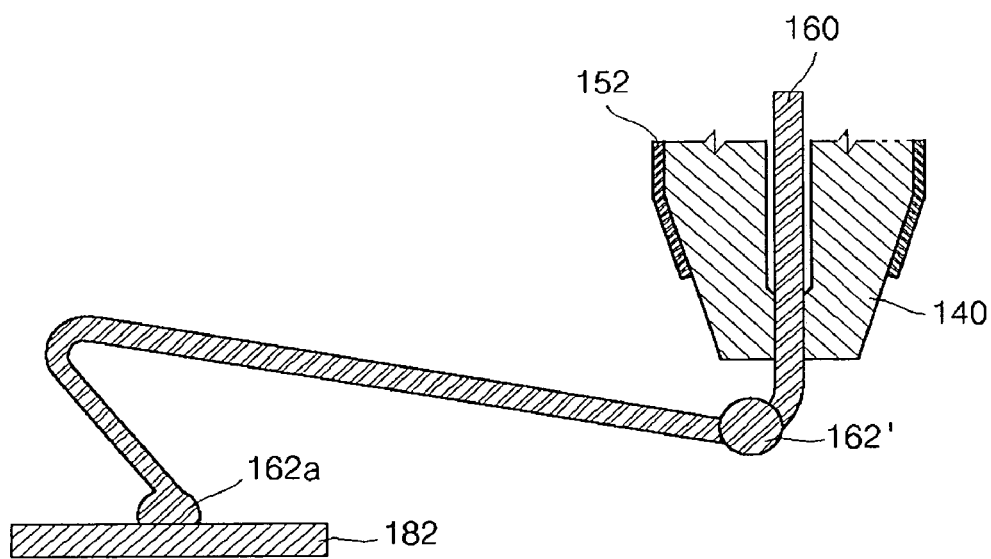
Figure 13K:
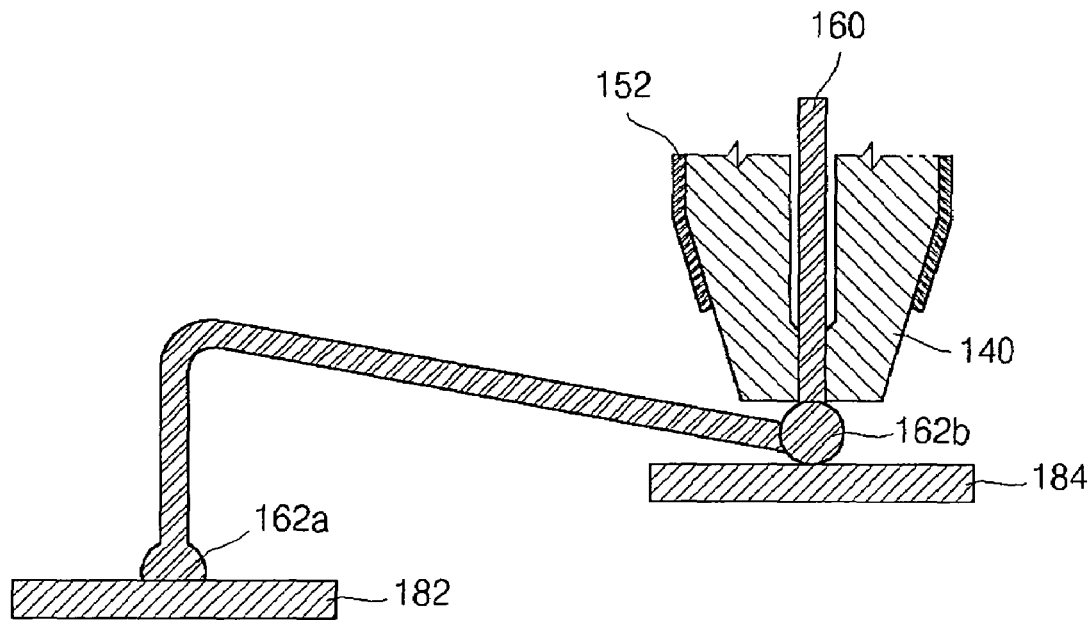
Figure 13L:
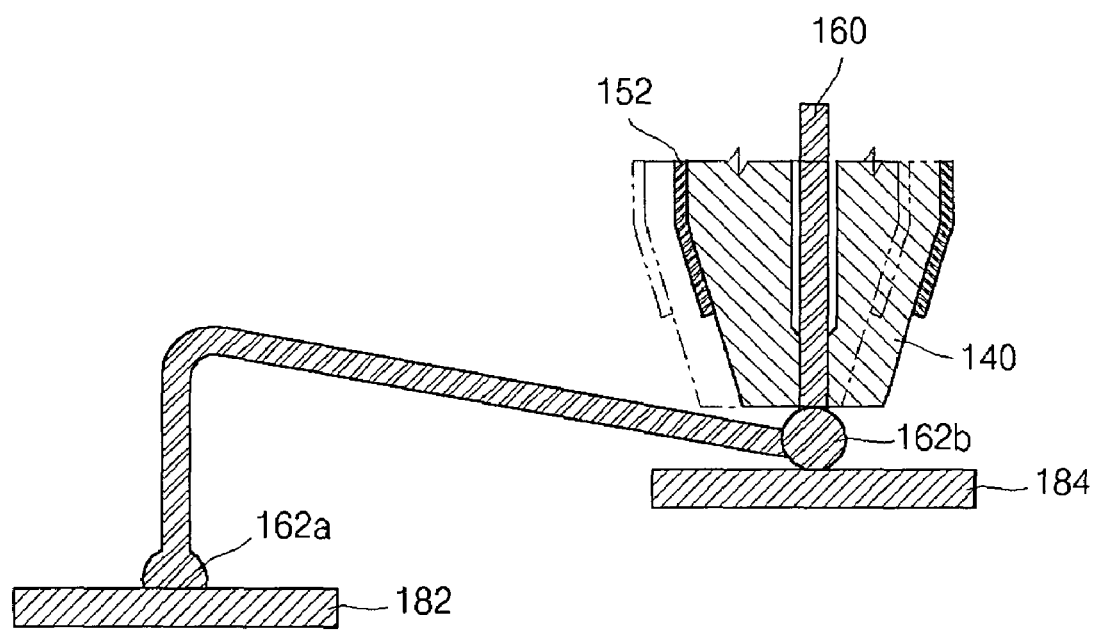
Figure 13M:
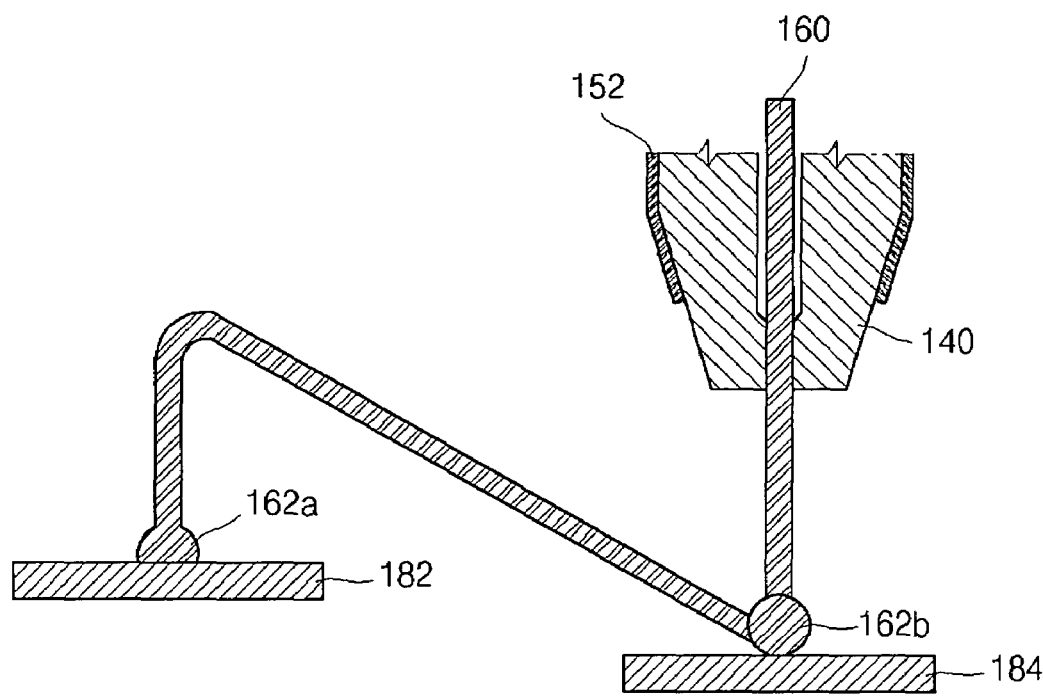
Figure 13N:
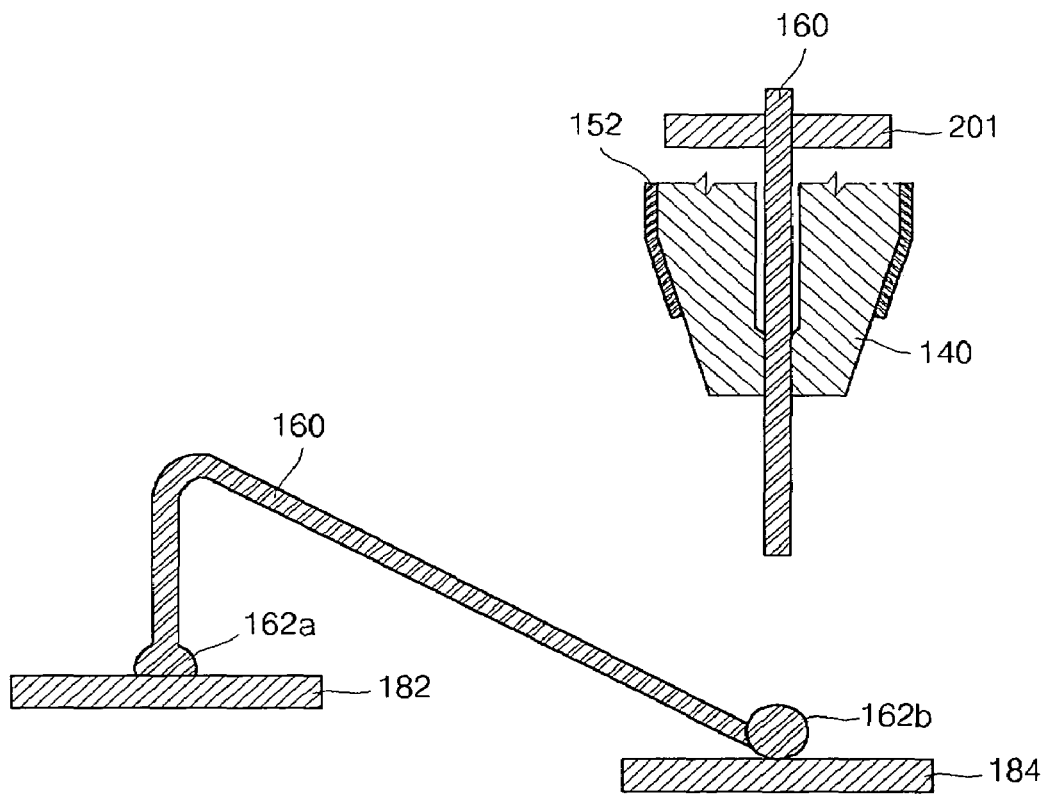
Figure 13O:
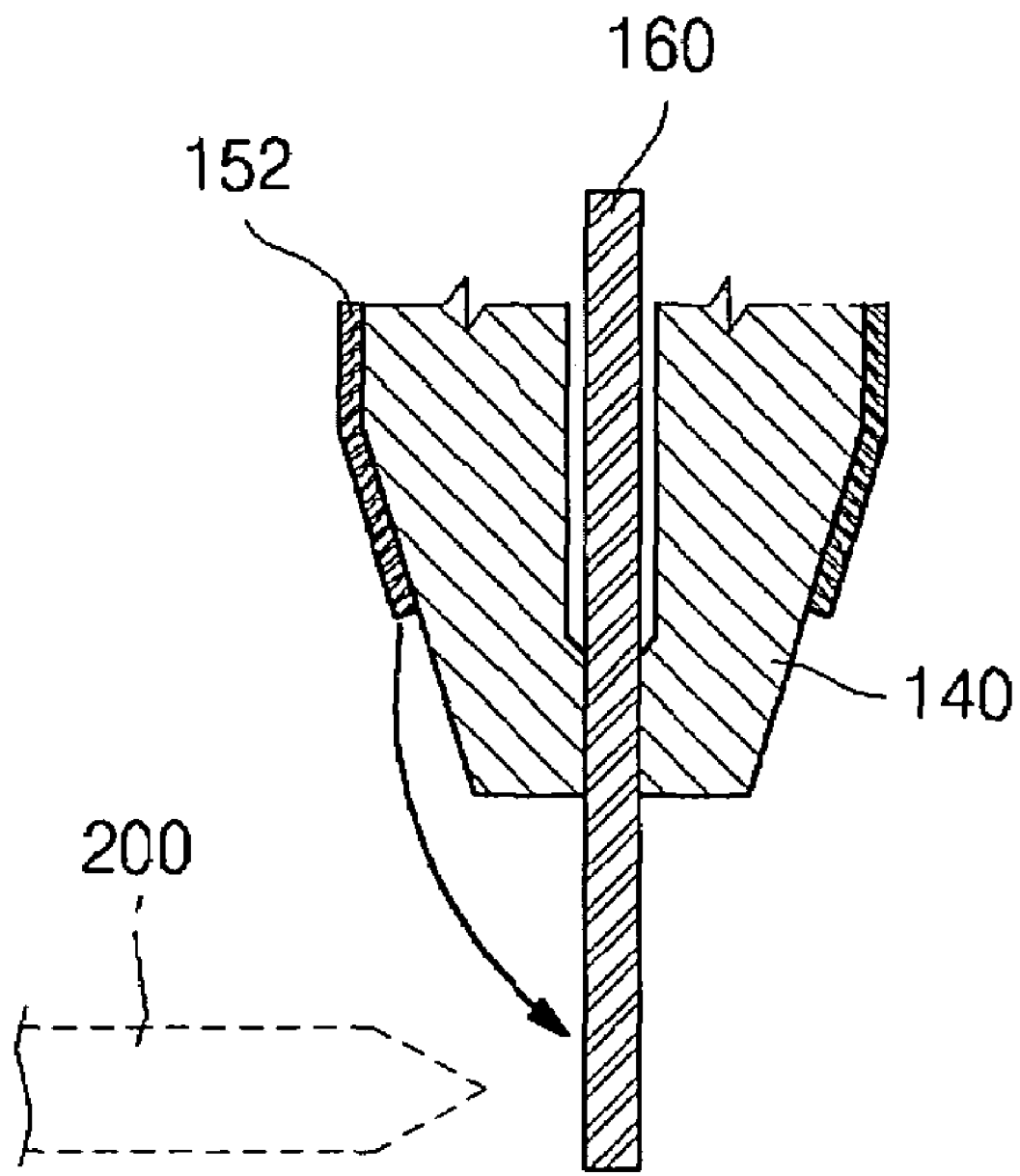

FIGS. 13A through 13O illustrate sequential steps of a process for wire bonding by a transducer assembly and a capillary according to the present invention. The shown example is based on an assumption that the discharge member includes a conductive layer 152 formed on the surface of the capillary 140 and performs the first ball bonding on the bond pad 182 of the semiconductor die and the second ball bonding on the electrically conductive pattern 184 of the substrate. Of course, the discharge member may have all the other structures as described above, and the ball bonding may be performed between bond pads 182 or between the electrically conductive pattern 184.

First, as shown in FIG. 13A, the discharge flame is transferred through the conductive layer 152 formed on the surface of the capillary 140 to the wire 160 at the lower end of the capillary 140. The wire at the lower end of the capillary 140 is instantly molten by the discharge flame and transformed into a substantially spherical ball 162 having a predetermined size. Here, the discharge flame may be provided 1~10 times through the conductive layer 152 in order to obtain a ball 162 having desired size and shape (spherical shape). Of course, it is okay to provide the discharge flame only one time through the conductive layer 152 when the discharge flame has sufficiently large power.

The ball 162 may be formed by using the discharge blade 200 provided at the wire bonder itself instead of the conductive layer 152 and the present invention does not exclude use of the discharge blade 200 itself.

Thereafter, as shown in FIGS. 13B and 13C, the capillary 140 is moved to a position above the bond pad 182 of the semiconductor die. The ball 162 is located on the inner chamfer formed at the lower end of the capillary 140.

Thereafter, as shown in FIG. 13D, the ball 162 located on the inner chamfer of the capillary 140 comes into close contact with the upper surface of the bond pad 182 and simultaneously ultrasonic wave is transferred through the horn 130 to the capillary 140, so that a first ball bonding area 162a is formed on the bond pad 182.

Next, as shown in FIG. 13E, the capillary 140 starts looping of the wire 160. In this case, the capillary 140 moves up to a kink height.

Then, as shown in FIGS. 13F and 13G, in order to form a wire loop, the capillary 140 arranges under the lower end of the capillary 140 a portion of the wire 160 as long as the wire loop.

Next, as shown in FIG. 13H, the capillary 140 provides discharge flame to a middle portion of the wire 160 through the conductive layer 152 formed on the surface of the capillary 140. That is, a portion of the wire located at the lower end of the capillary 140 is instantly molten by the discharge flame and is transformed into a substantially spherical ball 162' having a predetermined size. Here, the discharge flame may be provided 1~10 times through the conductive layer 152 in order to obtain a ball 162' having desired size and shape. Of course, it is okay to provide the discharge flame only one time through the conductive layer 152 when the discharge flame has a sufficient power. Even when the ball 162' is formed, the wire is not cut at the portion under the ball 162'. That is to say, when the ball 162' is formed, a portion of the wire is molten in an instant and the molten portion is then instantly solidified. Therefore, the wire is not cut due to the molten portion. Of course, the ball 162' is the portion for the second ball bonding which will be described below.

Next, as shown in FIG. 13I, the ball 162' is formed at a middle portion of the wire 160 located at the lower end of the capillary 140.

Thereafter, as shown in FIG. 13J, the capillary 140 guides the ball 162' formed at the middle portion of the wire 160 to the area above the electrically conductive pattern 184 of the substrate, which will be subjected to the second ball bonding.

Thereafter, as shown in FIG. 13K, the capillary 140 lowers the ball 162' onto the electrically conductive pattern 184 until the ball 162' is in contact with the portion which will be subjected to the second ball bonding.

Then, as shown in FIG. 13L, the capillary 140 applies ultrasonic energy to the ball 162' and the electrically conductive pattern 184 in close contact with each other, thereby forming the second ball bonding area 162b. Through this process, the second ball bonding area 162b is firmly fixed to the electrically conductive pattern 184. As a result, a bonding area as wide as that for the first ball bonding is arranged.

After the second ball bonding, the capillary 140 discharges a proper length of tail as shown in FIG. 13M.

Thereafter, as shown in FIG. 13N, the capillary 140 cuts the wire 160 and then moves to the initial position. Specifically, the clamp 201 which was in an open state above the capillary 140 comes to clamp the wire 160 so that the wire 160 cannot move, and then moves upward together with the capillary 140 by a predetermined distance so that the wire 160 is cut at a portion above the second ball bonding area 162b.

Finally, as shown in FIG. 13O, for the first ball bonding of next time, the capillary 140 provides discharge flame to the wire 160 at the lower end of the capillary 140 through the conductive layer 152 formed on the capillary 140 or the discharge blade 200 provided at the wire bonder, in order to form the ball 162 having desired size and shape. Then, the above-mentioned operation is repeated.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A transducer assembly comprising:
    a vibration unit for generating ultrasonic wave;
    a body section coupled to the vibration unit for transferring the ultrasonic wave;
    a tapered horn coupled to the body section for transferring and concentrating the ultrasonic wave;
    a capillary coupled to a front section of the horn, the capillary having a channel running the length thereof, a wire being inserted through the channel;
    a high-voltage source coupled to the tapered horn for sending a voltage to the capillary through the tapered horn; and
    a conductive coating on an outer surface of the capillary wherein the voltage generates a discharge flame on the conductive coating, the discharge flame transferred from the conductive coating to the wire.

2. The transducer assembly in accordance with claim 1, further comprising an insulating block coupled to the body section and the horn to protect the vibration unit from high voltage.

3. The transducer assembly in accordance with claim 1, wherein the conductive coating is formed a predetermined distance above a bottom end of the capillary.

4. The transducer assembly in accordance with claim 1, wherein the conductive coating has a shape of a substantially linear strip extending in a longitudinal direction on the capillary.

5. The transducer assembly in accordance with claim 1, wherein the horn is made from a conductive material.

6. The transducer assembly in accordance with claim 1, further comprising a capillary opening formed through the horn in the front section thereof, the capillary opening holding the capillary in the horn so that a bottom end of the capillary extends out of the horn.

7. The transducer assembly in accordance with claim 6, further comprising a fastening device coupled to a side surface of the horn for keeping the capillary in position in the capillary opening.

8. The transducer assembly in accordance with claim 1, wherein the vibration unit comprises an oscillator for generating ultrasonic waves.

9. The transducer assembly in accordance with claim 1, further comprising a mercury block coupled to the body section, the high-voltage source being coupled to the mercury block via a wire.

10. A transducer assembly comprising:
means for generating ultrasonic wave;
a body section coupled to the means for generating for transferring the ultrasonic wave;
a tapered horn coupled to the body section for transferring and concentrating the ultrasonic wave;
a capillary coupled to a front section of the horn, the capillary having a channel running the length thereof, a wire being inserted through the channel;
means coupled to the tapered horn for sending a voltage to the capillary through the tapered horn; and
a conductive coating on an outer surface of the capillary wherein the voltage generates a discharge flame on the conductive coating, the discharge flame transferred from the conductive coating to the wire.

11. A transducer assembly comprising:
a vibration unit for generating ultrasonic wave;
a body section coupled to the vibration unit for transferring the ultrasonic wave;
a capillary through which a wire is inserted, the wire being movable up and down to perform ball bonding;
a tapered horn coupled to the body section and the capillary for transferring and concentrating the ultrasonic wave;
a conductive coating on an outer surface of the capillary;
a high-voltage source coupled to the tapered horn for applying a voltage signal to the tapered horn, the voltage signal sent to the capillary to generate a discharge flame; and
an insulating block coupled to the body section and the tapered horn to protect the vibration unit from the voltage signal of the high voltage source.

12. The transducer assembly in accordance with claim 11, further comprising a mercury block coupled to the body section, the high-voltage source being coupled to the mercury block via a wire.

13. The transducer assembly in accordance with claim 11, wherein the conductive coating is formed a predetermined distance above a bottom end of the capillary.

14. The transducer assembly in accordance with claim 11, wherein the conductive coating is formed a predetermined distance below a top end of the capillary to prevent a discharge flame from being transferred to the wire.

15. The transducer assembly in accordance with claim 11, wherein the horn is made from a conductive material.

16. The transducer assembly in accordance with claim 11, further comprising a capillary opening formed through the horn in the front section thereof, the capillary opening holding the capillary in the horn so that a bottom end of the capillary extends out of the horn.

17. The transducer assembly in accordance with claim 16, further comprising a fastening device coupled to a side surface of the horn for keeping the capillary in position in the capillary opening.

18. The transducer assembly in accordance with claim 11, wherein the vibration unit comprises an oscillator for generating ultrasonic waves.

* * * * *